(12) United States Patent
Ikeda

(10) Patent No.: US 9,209,194 B1
(45) Date of Patent: Dec. 8, 2015

(54) SEMICONDUCTOR CONSTRUCTIONS COMPRISING FUSE CAPACITORS

(71) Applicant: Micron Technology, Inc., Boise, ID (US)

(72) Inventor: Takenobu Ikeda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/539,482

(22) Filed: Nov. 12, 2014

(51) Int. Cl.
| | |
|---|---|
| *H01L 21/8242* | (2006.01) |
| *H01L 27/108* | (2006.01) |
| *H01L 23/525* | (2006.01) |
| *H01L 23/522* | (2006.01) |
| *H01L 23/528* | (2006.01) |
| *H01L 23/532* | (2006.01) |
| *H01L 29/06* | (2006.01) |

(52) U.S. Cl.
CPC ........ *H01L 27/10897* (2013.01); *H01L 23/528* (2013.01); *H01L 23/5222* (2013.01); *H01L 23/5252* (2013.01); *H01L 23/5329* (2013.01); *H01L 23/53271* (2013.01); *H01L 27/10814* (2013.01); *H01L 29/0649* (2013.01)

(58) Field of Classification Search
CPC ............... H01L 27/10897; H01L 27/10814; H01L 23/5252; H01L 23/5222; H01L 23/528; H01L 23/5329; H01L 23/53271; H01L 29/0649

See application file for complete search history.

(56) References Cited

U.S. PATENT DOCUMENTS

| | | | |
|---|---|---|---|
| 7,683,456 B2 | 3/2010 | Manning | |
| 2002/0022317 A1* | 2/2002 | Fukuzumi | ..................... 438/253 |

* cited by examiner

*Primary Examiner* — Long Pham
(74) *Attorney, Agent, or Firm* — Wells St. John P.S.

(57) ABSTRACT

Some embodiments include a semiconductor construction having a semiconductor substrate and an interlayer insulating material over the substrate. Memory cells are supported by the substrate, and each memory cell includes a cell transistor and a cell capacitor. The cell transistor has source and drain regions extending into the semiconductor substrate. A conductive plug extends through the interlayer insulating material and is in electrical contact with one of the source and drain regions, and with the cell capacitor. The construction also includes at least one anti-fuse having a fuse capacitor. A covering material is between the fuse capacitor and the interlayer insulating material, and is in direct contact with the interlayer insulating material. The covering material is of a different composition than the interlayer insulating material.

21 Claims, 21 Drawing Sheets

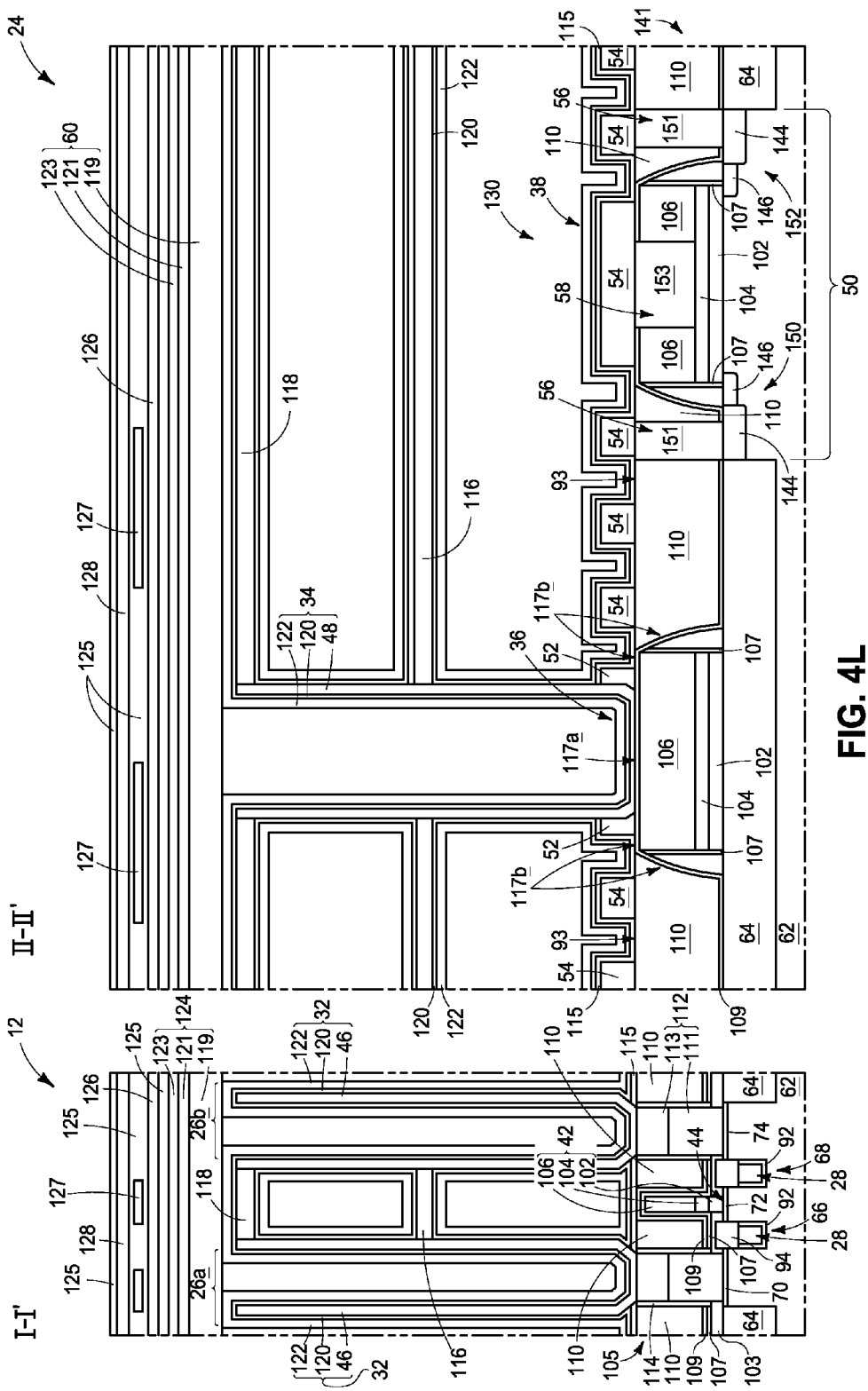

US 9,209,194 B1

SEMICONDUCTOR CONSTRUCTIONS COMPRISING FUSE CAPACITORS

TECHNICAL FIELD

Semiconductor constructions comprising fuse capacitors.

BACKGROUND

DRAM (dynamic random access memory) manufacture may employ a redundancy circuit technique in which defective memory cells are replaced with redundant memory cells in rows and/or columns. Such replacement may be performed using laser fuse elements. Laser irradiation of one or more selected laser fuse elements may be utilized to blow them. So-called anti-fuse elements may be used in place of the laser fuse elements (see, for example, U.S. Pat. No. 7,683,456), and such anti-fuse elements may utilize fuse capacitors. High voltage may be applied to a fuse capacitor to create a short circuit between lower and upper electrodes.

BRIEF DESCRIPTION OF THE DRAWINGS

FIGS. 4A-L illustrate processing stages of an example embodiment method of forming example embodiment structures. FIGS. 4A-L illustrate cross-sectional views along the lines I-I' of FIG. 2 and II-II' of FIG. 3 at the various process stages.

FIGS. 6A-E illustrate cross-sectional views along the lines I-I' of FIG. 2 and II-II' of FIG. 3 at the various process stages.

DETAILED DESCRIPTION OF THE ILLUSTRATED EMBODIMENTS

In some embodiments, anti-fuses comprise fuse capacitors. Portions of the fuse capacitors may be formed simultaneously with portions of capacitors utilized in memory cells. In some embodiments, insulator material (for instance, an interlayer insulating film) extends across a memory region of a substrate and across a peripheral region adjacent to the memory region. The anti-fuses are formed within the peripheral region, and the memory cells are formed within the memory region. The fuse capacitors of the anti-fuses are spaced from the insulator material by at least a covering material (also referred to as an intervening element or an intervening material) which is in direct contact with the insulator material, and which is of a different composition than the insulator material. For instance, in some embodiments, the covering material may comprise, consist essentially of, or consist of silicon nitride; and the insulator material may comprise, consist essentially of, or consist of silicon dioxide.

The above-described aspects, as well as other aspects, are described below in example embodiments.

First Example Embodiment

Figure 1:
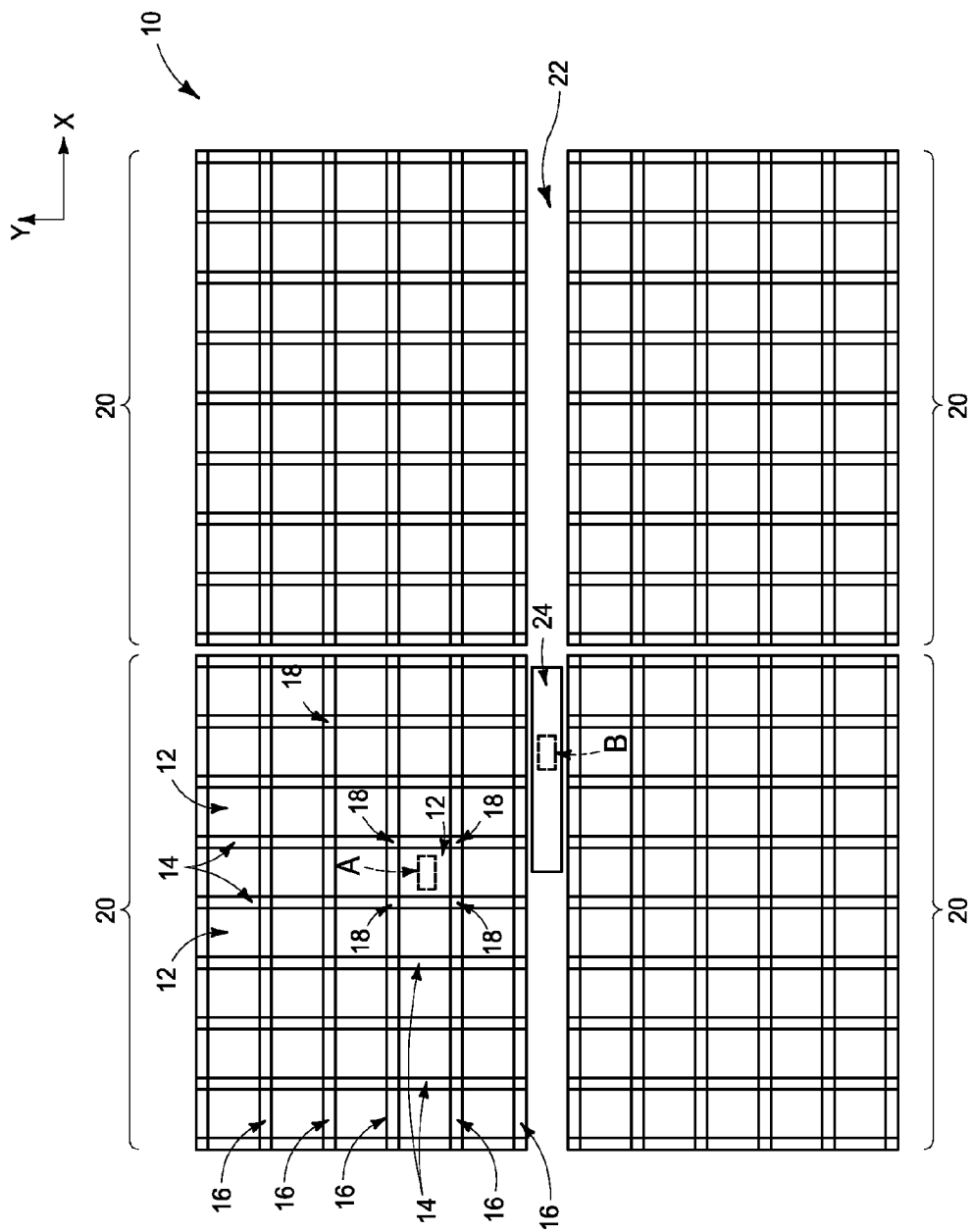
FIG. 1 is a plan view of region of a semiconductor construction including example embodiment memory and periphery regions.

FIG. 1 is a plan view showing a schematic configuration of a semiconductor construction 10 comprising DRAM. The DRAM is configured to include a plurality (for instance, 160) of memory cell areas 12 (only some of which are labeled). Sub-word drivers, SWDs, 14 (only some of which are labeled) are arranged on both sides of each of the memory cell areas along an X direction. Sense amplifiers, SAs, 16 (only some of which are labeled) are arranged on both sides of each of the memory cell areas along a Y direction. Cross areas 18 (only some of which are labeled) occur at four vertexes surrounding a memory cell area. The memory cell areas, SWDs, SAs and cross areas are comprised by a memory cell region 20. A remaining region 22 adjacent the memory cell region may be called a peripheral area (i.e., peripheral region). The peripheral area is shown to include an anti-fuse area 24.

Figure 2:
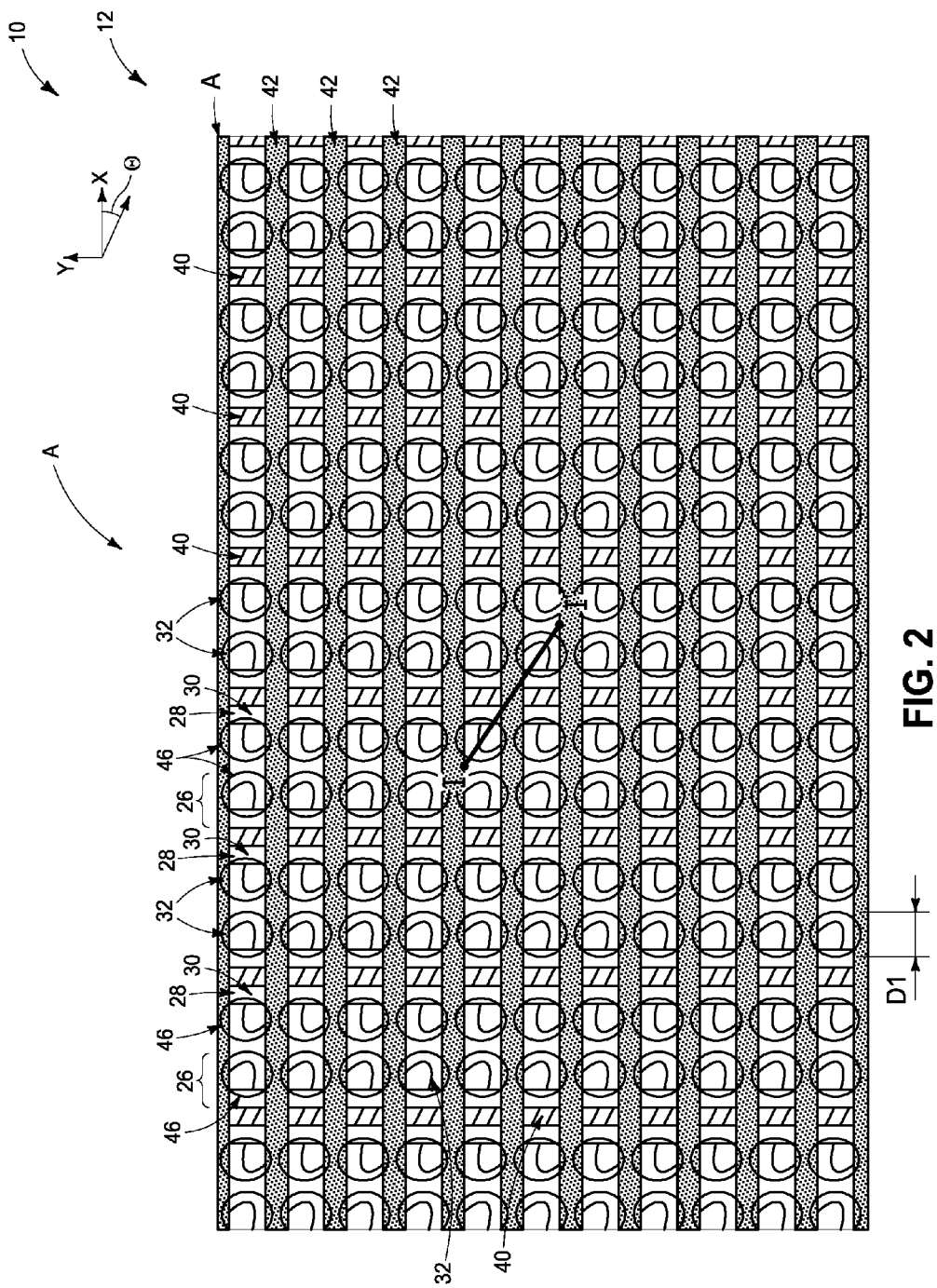
FIG. 2 is a perspective plan view of a portion A of FIG. 1.

FIG. 2 shows a perspective plan view illustrating a portion A of a memory cell area 12 of FIG. 1. A manufacturing operation may be performed relative to portion A to form memory cells 26 (only some of which are labeled). FIG. 4L shows a cross-sectional view along line I-I' of FIG. 2, and may be considered to show a cell capacitor formed relative to the first example embodiment. A plurality of the memory cells 26 are formed across the memory cell area 12 of FIG. 2. The memory cells include cell gates 28 (only some of which are labeled) arranged along wordlines 30 (only some of which are labeled), and include cell capacitors 32 (only some of which are labeled). The wordlines may be metal wordlines in some embodiments.

Figure 3:
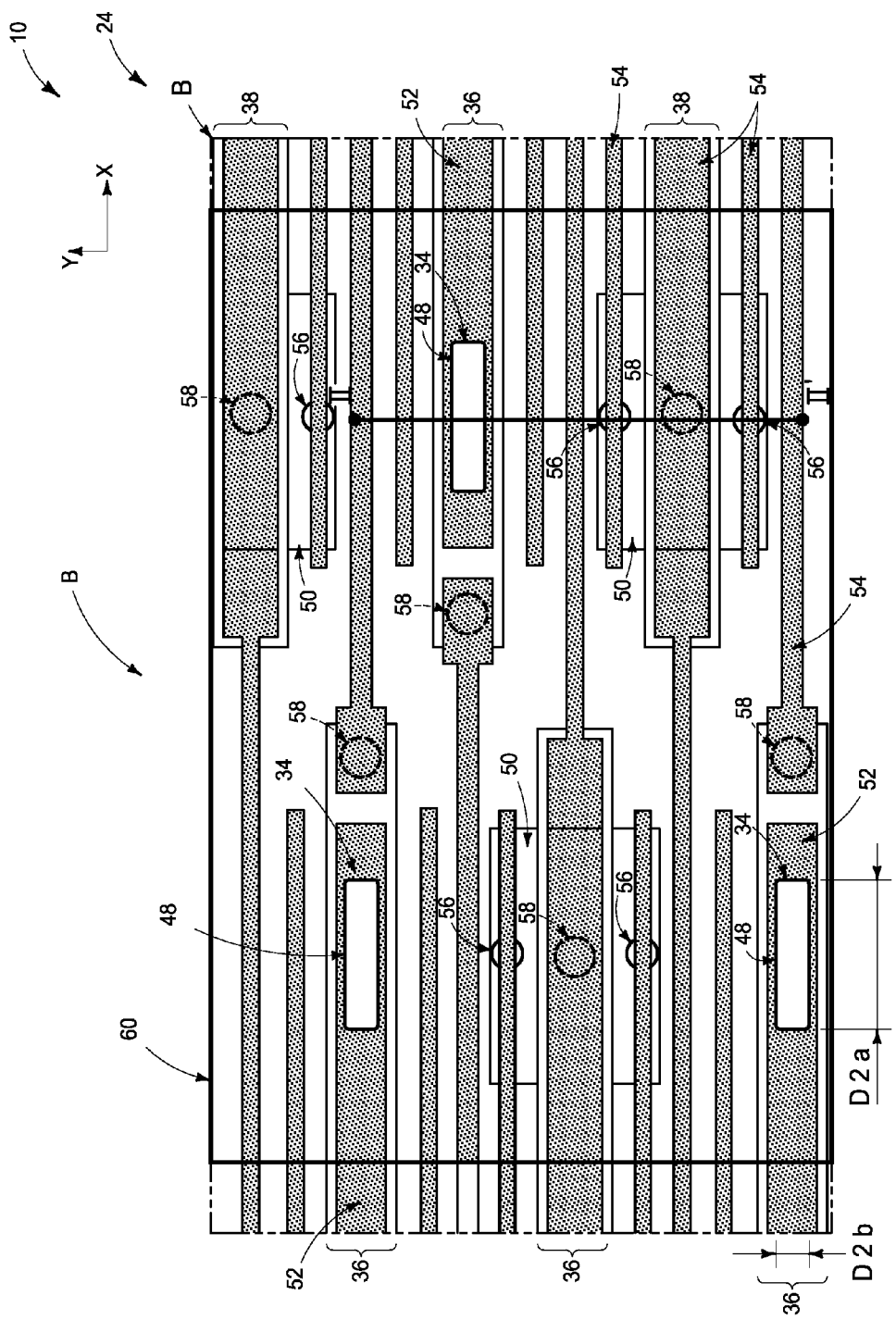
FIG. 3 is a perspective plan view of a portion B of FIG. 1.

FIG. 3 shows a perspective plan view illustrating a portion B of the anti-fuse area 24 of FIG. 1. A manufacturing operation may be performed relative to portion B to create fuse capacitors 34 suitable for utilization as anti-fuses. FIG. 4L shows a cross-sectional view along II-II' of FIG. 3, and may be considered to show a fuse capacitor formed relative to the first example embodiment. The fuse capacitors 34 of FIG. 3 are adjacent peripheral gates 36 and 38. The gates 36/38 may serve as gate electrodes of peripheral transistors (gates 38), or may be conductors having no transistor function (gates 36).

Referring to FIG. 2, the memory cell area 12 includes not only the wordlines 30 and the cell capacitors 32, but also a plurality of first active areas 40 (only some of which are labeled) and a plurality of bitlines 42 (only some of which are labeled). The first active areas are arranged relative to an X direction and a Y direction. A planar shape of each of the first active areas is oriented in an oblong direction relative to the X direction; with such oblong direction being shown at angle θ. The bitlines 42 are arranged in rows along the first active areas, and extend along the X direction. Each of the bitlines may pass above the central region of each of the first active areas in a corresponding row of first active areas. A bit contact 44 (shown in FIG. 4L) is formed in the central region of each of the first active areas, and the bitlines and the central regions of the first active areas are electrically connected to one another through the bit contact. The cell capacitors 32 comprise lower capacitor electrodes 46; and paired lower capacitor electrodes are arranged on opposing side regions of each of the first active areas in the θ direction. The lower capacitor electrodes have upwardly-opening container shapes in the shown embodiment (as shown in FIG. 4L); and such container shapes may be, for example, cylindrical; and may have diameters D1 of, for example, about 15 nm.

Referring to FIG. 3, the fuse capacitors 34 have lower anti-fuse electrodes 48. Such electrodes are within the anti-fuse area 24. Also within the anti-fuse area are the peripheral gates 36/38, a plurality of second active areas 50, wires 52/54 (which may also serve as wiring patterns; and which may comprise, for example, tungsten (W), and only some of which are labeled), first peripheral contact plugs 56, second peripheral contact plugs 58, and a counter anti-fuse plate 60. The shown arrangement of lower anti-fuse electrodes is one example arrangement, and it is to be understood that the number of lower anti-fuse electrodes and their arrangement may be different in other embodiments. Each of the lower anti-fuse electrodes 48 may have an upwardly-opening container shape (as shown in FIG. 4L). In some embodiments, such container shape may have dimensions of D2a×D2b of about 150×50 nm; which may be considerably larger in cross-sectional dimension than the diameter D1 of the lower capacitor electrode 46 in the memory cell area 12.

The lower anti-fuse electrodes 48 are shown formed on peripheral gates 36, and are not directly over second active areas 50. The second active areas 50 are arranged such that peripheral gates 38 are directly over central portions of the second active areas. Each of the second active areas is divided by two in a Y direction to form first and second peripheral diffusion regions (FIG. 4L) serving as source/drain regions 150/152.

The wires 52/54 are sub-divided amongst two groups. The wires 52 of the first group are on the peripheral gate 36 and under the lower anti-fuse electrode 48, and are connected to the lower anti-fuse electrodes 48 (as shown in FIG. 4L). The wires 52 of the first group may be regarded as conductive pads that directly contact lower portions of the lower anti-fuse electrodes. The wires 54 of the second group include wires electrically connected to the source/drain regions through the first peripheral contact plugs 56 (FIG. 4L), and include wires electrically connected to the peripheral gate 38 through the second peripheral contact plugs 58 (FIG. 4L). The wires 54 of the second group are not directly connected to the lower anti-fuse electrodes.

The counter anti-fuse plate 60 is configured such that a conductive plate is laminated on a common upper anti-fuse electrode 122 (FIG. 4L) and arranged to be common to the plurality of lower anti-fuse electrodes 48 (three in the example configuration of FIG. 3).

The memory cell area (or region) 12 of FIG. 4L includes a semiconductor substrate 62 comprising a region of the oblong first active area in the longitudinal direction (θ direction of FIG. 2). Isolation 64 extends within trenches in the substrate (specifically, in the shown example embodiment the isolation is trenched isolation of shallow trench isolation (STI)).

Two transistors 66/68 are illustrated in memory cell area 12 of FIG. 4L. The transistors 66/68 may be referred to as memory cell transistors, or simply as cell transistors. Each cell transistor comprises a cell gate 28 and a pair of source/drain regions. Specifically, transistor 66 comprises source/drain regions 70/72, and transistor 68 comprises source/drain regions 72/74; with the source/drain region 72 being shared by the transistors.

The transistors 66/68 are incorporated into a pair of memory cells 26a/26b, with each memory cell comprising a cell capacitor 32 coupled with one of the transistors 66/68 through a source/drain region. Specifically, each cell capacitor is electrically coupled with a conductive plug 112, which in turn is electrically coupled with one of the source/drain regions 70/74.

The cell gates 28 are along wordlines 30 (described above with reference to FIG. 2) that extend in and out of the page relative to the cross-section of FIG. 4L. Such wordlines extend within trenches in the semiconductor substrate in the shown embodiment. Thin insulation 92 (e.g., a film) lines internal walls of the trenches, and the wordlines are formed within the lined trenches. Cap insulator material 94 (e.g., a film) is formed across upper surfaces of the wordlines. The materials 92/94 may, for example, comprise, consist essentially of, or consist of silicon nitride. The materials 92/94 may be same thickness as one another, or may be different thicknesses relative to one another.

The shared source/drain region 72 is a bit contact diffusion region, and is between the cell gates 28 (i.e., between the wordlines). A bitline 42 is electrically coupled to the bit contact diffusion region 72 through an illustrated bit contact 44. The illustrated example bitline comprises a cap insulating film 106 (which may comprise, for example, silicon nitride), a metal-containing region 104 (for instance, a region comprising one or both of tungsten and tungsten nitride), and a semiconductor-containing region 102 (for instance, a region comprising conductively-doped polysilicon). Although not shown, a metal silicide (for instance, tungsten silicide) may be interposed between the metal-containing region and the semiconductor-containing region to reduce resistance.

Insulator materials 107 and 109 are along sidewalls of the bitline 42. Such insulator materials may be a same composition as one another; and may, for example, comprise, for example, silicon nitride. The materials 107 and 109 may be the same thickness as one another, or may be of different thickness relative to one another.

A bitline interlayer 105 is along an outside of insulator material 109. The bitline interlayer may correspond to a spin-on dielectric (SOD) film modified into a silicon oxide material (e.g., film) 110. In some embodiments, material 110 may be referred to as an interlayer insulating material, or film. The silicon nitride materials 107/109 may function as protective material (e.g., an anti-oxidant barrier film) when the bitline interlayer is formed. For instance, the materials 107/109 may prevent bitline material from being oxidized. Accordingly, in some embodiments the materials 107/109 may be referred to as protective materials (or films) utilized for protecting adjacent conductive material of the bitline 42 during formation of the spin-on dielectric film 110.

The material 109 may be referred to as a covering material, in that it covers a plurality of underlying materials.

The shared source/drain region 72 may be referred to as an inner source/drain region, and the other source/drain regions 70 and 74 may be referred to outer source/drain regions. The outer source/drain regions are utilized as cell contact diffusion regions. Cell capacitors 32 are formed to be electrically coupled with the cell contact diffusion regions. In the shown embodiment, conductive cell contacts 112 are provided between the cell capacitors 32 and the cell contact diffusion regions 70/74. The cell contacts 112 may comprise, for example, conductively-doped semiconductor material 111 (for instance, doped polysilicon) under a metal-containing material 113 (the metal-containing material may comprise, for example, one or both of tungsten and titanium nitride). Additionally, a metal silicide (for example, cobalt silicide) may be interposed between the doped semiconductor material 111 and the metal-containing material 112 to reduce resistance. The cell contacts 112 may be referred to as conductive plugs; and such conductive plugs extend through the interlayer insulating material (or film) 110.

Insulating material 114 (for instance, silicon nitride) is formed along sidewalls of the cell contacts.

The cell capacitors 32 comprise lower capacitor electrodes 46 configured as upwardly-opening container shapes. In the shown embodiment, such container shapes are cylindrical shapes. The lower capacitor electrodes 46 penetrate a cylinder stopper material, or film, 115 (which may be, for example, silicon nitride). The lower capacitor electrodes 46 are supported by first and second cylinder support structures 116/118 in the shown embodiment. Such cylinder support structures may comprise, for example, silicon nitride. The material of the support structures may be referred to as support structure material.

Capacitor dielectric 120 is formed to cover an upper surface of the cylinder stopper material 115, internal and external peripheral surfaces of the lower capacitor electrode 46, and upper and lower surfaces of the first cylinder support structure 116 and the second cylinder support structure 118. An upper capacitor electrode 122 is formed to cover the surface of the capacitor dielectric 120.

A counter capacitor plate 124 is formed over the top electrode 122, and covers the entirety of cell capacitors 32. In the shown embodiment, such counter capacitor plate 124 is a laminate film obtained by laminating a silicon nitride film 123 (serving as an insulating film), a conductive film 121 (for instance, comprising a tungsten/tungsten nitride film) and a conductive film 119 (for instance, doped polysilicon/boron-silicon-germanium).

A wiring pattern containing first metal 126, second metal 127, and third metal 128 is formed over the counter capacitor plate 124, and separated from the plate 124 and one another by insulative material 125 (which may comprise, for example, silicon nitride and/or silicon dioxide). The wiring pattern may be considered to comprise metal film(s) within an insulative material 125 in some embodiments.

The anti-fuse area (or region 24) of FIG. 4L comprises an anti-fuse 34 (specifically, a fuse capacitor configured for utilization as an anti-fuse) adjacent a peripheral transistor 130. Two peripheral gates 36 and 38 are illustrated. The right peripheral gate 38 serves as a constituent element of the peripheral transistor 130. The left peripheral gate 36 is a conductor formed on the trenched isolation 64.

The left peripheral gate 36, like the bitline 42, may be configured to comprise silicon nitride 106 (serving as a cap insulating film), tungsten/tungsten nitride material 104, and doped semiconductor material 102. A metal silicide (for instance, tungsten silicide) may be interposed between the tungsten/tungsten nitride (W/WN) material 104 and the doped semiconductor material 102 to reduce resistance. The materials 102 and 104, together with the metal silicide which may be between such materials, may be referred to as a conductive region; with such conductive region of gate 36 being between substrate 62 and the covering material 109 (which may also be referred to as an intervening element) in the illustrated embodiment. The conductive region of gate 36 is over trenched isolation region 64. The conductive region of gate 36 may be considered to have a top surface corresponding to the uppermost surface of material 104.

Insulating material is along sidewalls of the peripheral gates 36/38, with such insulating material comprising the first silicon nitride material 107, a silicon oxide material 142, and the second silicon nitride material (i.e., the covering material) 109. A peripheral gate interlayer 141 is on the outside of the second silicon nitride material 109. The peripheral gate interlayer 141 may be formed simultaneously with a bitline interlayer 105, and comprises silicon oxide interlayer insulating material 110. The interlayer insulating material 110 thus extends across both of the memory cell area 12 and the anti-fuse area 24; and is laterally between bitline 42 and the conductive region of gate 36.

The second silicon nitride material 109 may function as an antioxidant barrier film in formation of the peripheral gate interlayer 141 to prevent materials of the peripheral gate 38 from being oxidized. Accordingly, the second silicon nitride material 109 may be called an insulation film, or protective film, utilized for protecting adjacent materials during the oxidative conditions utilized in forming the silicon oxide material 110. Alternatively, material 109 may simply be referred to as covering material, in that it covers various members and materials of FIG. 4L; or may be referred to as insulation material.

In some embodiments, the protective material (or film) 109 may alleviate or prevent the interlayer insulating film 110 from being etched by HF (Hydrofluoric acid) chemical treatment in formation of the lower anti-fuse electrode 48 (discussed below). When an ordinary plasma oxide film is used as the interlayer insulating film in place of SOD-formed material 110, the insulating film liner of the SOD may not be required. In this case, silicon nitride 109 may still be utilized during the HF chemical treatment to alleviate or prevent undesired etching of the interlayer insulating material 110.

In the shown embodiment, the covering material 109 has a first surface 117a in direct contact with lower anti-fuse electrode 48 of the anti-fuse 34, and has second surfaces 117b laterally offset from the first surface and in direct contact with the interlayer insulating material (or film) 110. The insulating material 110 may be considered to comprise a planar upper surface, or main surface, 93; and the first surface 117a is substantially coplanar with such main surface.

In some embodiments, material 106 may be referred to as a first cap insulating material (or film) over conductive material 104 of the bitline 42, may be referred to as a second cap insulting material (or film) over conductive material of peripheral gate 36, and may be referred to as a third cap insulting material (or film) over conductive material of peripheral gate 38. The material 109 may be referred to as a covering material (or film) that extends across and directly against the first, second and third cap insulating materials (or films). All of the first, second and third cap insulating materials (or films) may comprise a same composition as one another; and may, for example, comprise silicon nitride; and the covering material may also comprise such same composition. Alternatively, one or more of the first cap insulating material, second cap insulating material, third cap insulating material and covering material may comprise a different composition than one or more others of such materials.

First and second peripheral diffusion regions 144/146 are formed on both the sides of the right peripheral gate 38, and extend into the semiconductor substrate 62. Such diffusion regions are incorporated into source/drain regions 150/152.

On the left peripheral gate 36 is a wire 52 from the first group of wires. Such connects to the lower anti-fuse electrode 48 to operate as a conductive pad of the lower anti-fuse electrode 48. The wire 52 directly contacts the first surface 117a of covering material 109; and in the shown embodiment is elongated over the first surface 117a along the illustrated cross-section to extend laterally outward beyond each of the opposing sides of fuse capacitor 34.

Wires 54 from the second group of wires include wires adjacent to the right peripheral gate 38, with some of the wires 54 electrically connecting to the source/drain regions 150/152 through conductive plugs 151, and another one of wires 54 electrically connecting to the peripheral gate 38 through a conductive plug 153. The plugs 151 may be considered examples of first peripheral contacts 56, and the plug 153 may be considered an example of a second peripheral contact 58.

The wires 52/54 may, for example, comprise, consist essentially of, or consist of tungsten.

The lower anti-fuse electrode 48 has an upwardly-opening container shape, and passes through the wire 52. The lower anti-fuse electrode 48 also extends through the cylinder stopper material 115. The material 115 (e.g., a film) may comprise silicon nitride, and accordingly may be resistant to being etched by an HF chemical treatment (described below). The material 115 may thus serve as protective liner during an HF treatment. The cylinder stopper material 115 is directly against the silicon nitride material 109 on the peripheral gates 36/38.

The lower anti-fuse electrode 48 is supported by the first and second cylinder support structures 116/118 discussed previously.

Anti-fuse dielectric 120 is over an upper surface of the cylinder stopper material 115, is along internal and external peripheral surfaces of the lower anti-fuse electrode 48, and is along upper and lower surfaces of the cylinder support structure 116 and the second cylinder support structure 118.

Upper anti-fuse electrode 122 is over the anti-fuse dielectric 120.

The counter anti-fuse plate 60 (comprising materials 119, 121 and 123 in the shown embodiment) extends across the illustrated portion of anti-fuse region 24.

The wiring pattern containing first metal 126, second metal 127, and third metal 128 is over the anti-fuse plate 60.

In the illustrated embodiment of FIG. 4L, zero potential may always be set on the counter anti-fuse plate side. An anti-fuse immediately above any of the wires 52 can then be short-circuited by applying a high voltage to the wire.

Figure 4A:
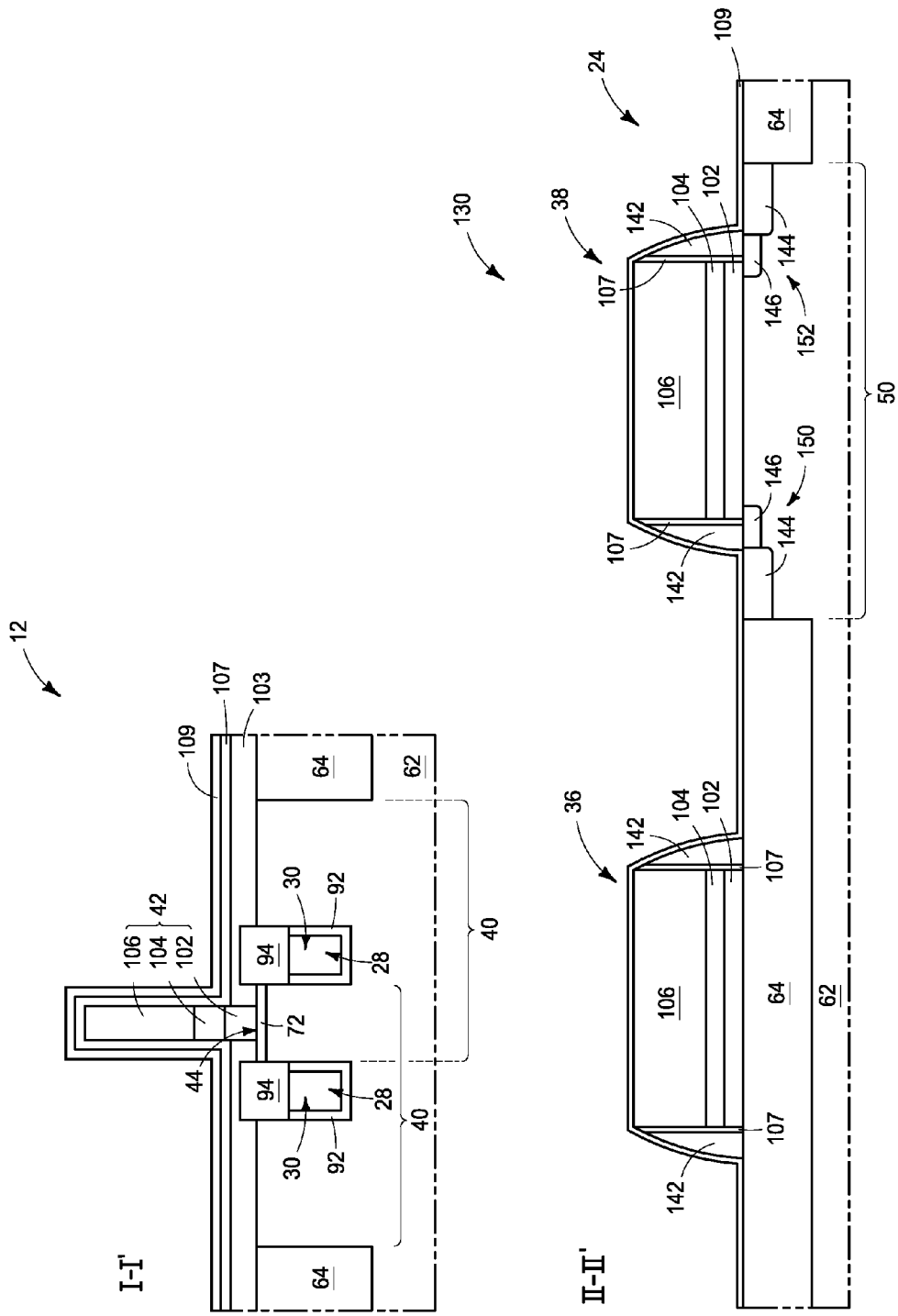
Figure 4B:
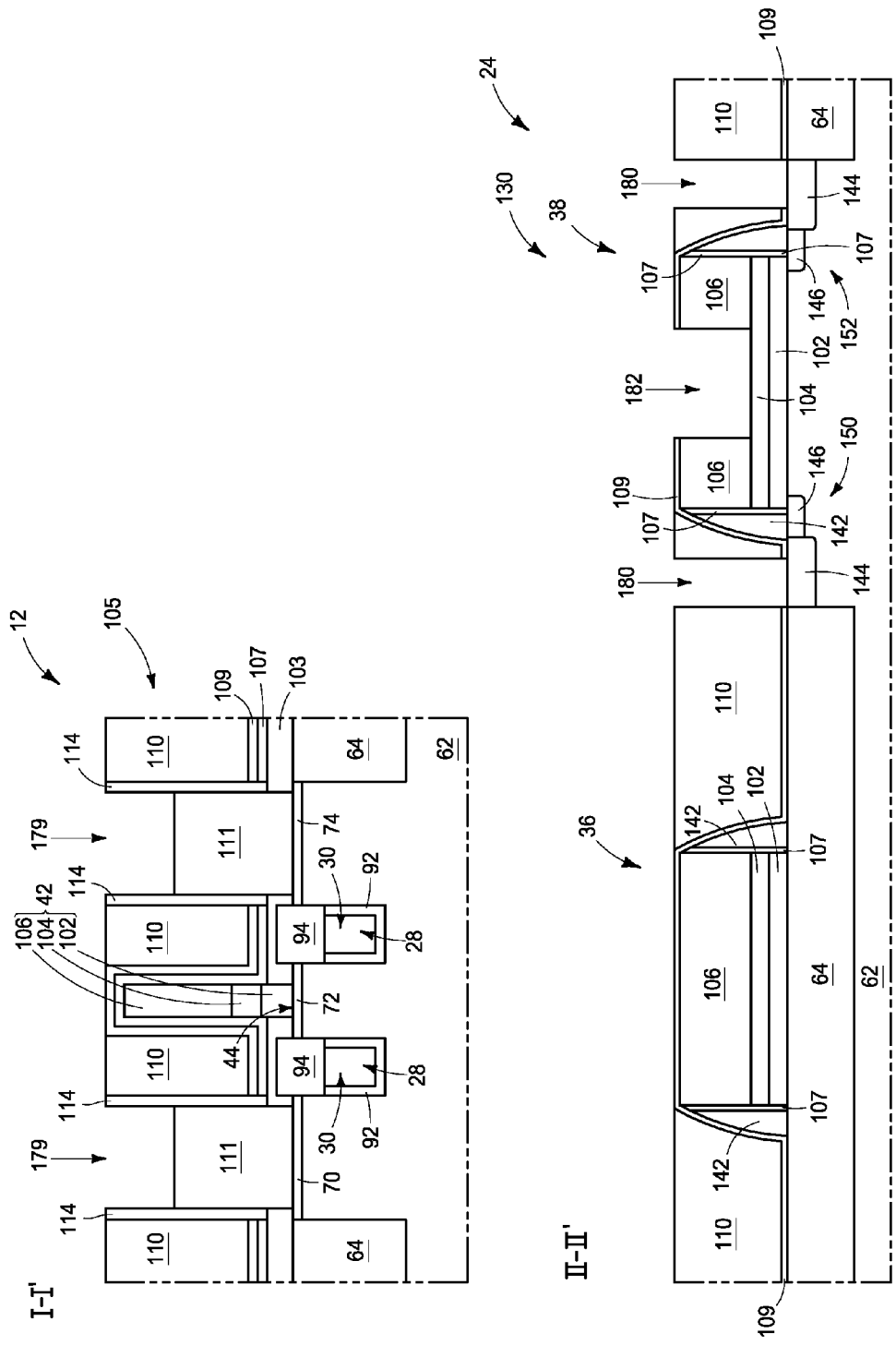
Figure 4C:
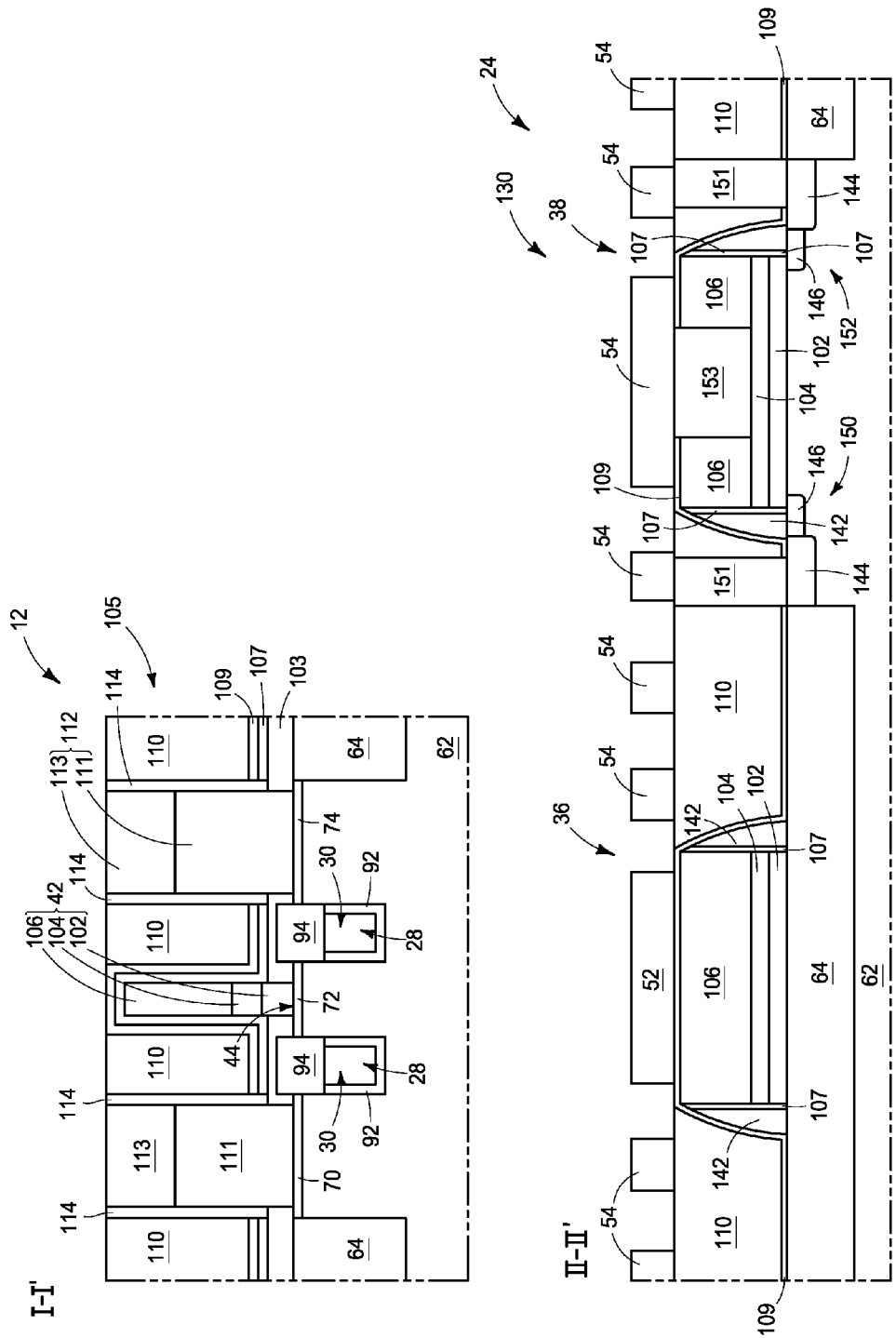

An example manufacturing method for fabricating example structures of the first embodiment is described with reference to FIGS. 4A-L. The I-I' views in FIG. 4A to FIG. 4K, like the I-I' view in FIG. 4L, illustrate a sectional view of the memory cell area 12 of FIG. 2 along the line I-I'; and the II-II' views illustrate a sectional view of the anti-fuse area 24 of FIG. 3 along the line II-II'. In FIGS. 4A-C, the scale of the sectional view along the I-I' line, for descriptive convenience, is increased relative to the sectional view along the II-II' line.

Referring FIG. 4A, the trenched isolation 64 is formed to extend into semiconductor substrate 62. Overlapping first active areas 40 are formed within the memory cell area 12. A second active area 50 is formed within the anti-fuse area 24.

The substrate 62 may comprise any suitable semiconductor material, and in some embodiments may comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Paired wordlines 30 are formed within the illustrated region of the memory cell area 12.

A bit contact interlayer 103 is formed over substrate 62 and trenched isolation 64. The bit contact interlayer may comprise any suitable composition or combination of compositions; and may, for example, comprise silicon oxide.

A bit contact 44 is formed by exposing a region between the paired wordlines 30. The bit contact 44 extends through the bitline interlayer 103. A bit contact diffusion region 72 is formed by ion implantation on the surface of the substrate 62 exposed by the bit contact 44. Bitline 42 and peripheral gates 36/38 are simultaneously formed on the memory cell and peripheral areas 12 and 24. The bitline and peripheral gates comprise the materials 102, 104 and 106 described above. Although not shown, metal silicide may be interposed between the materials 102 and 104 in some embodiments.

The first peripheral diffusion regions 146 are formed by ion implantation into substrate 62 on both the sides of the right peripheral gate 38. The first peripheral diffusion regions 146 may be activated by a subsequent annealing treatment.

First silicon nitride sidewall 107 is formed along sidewalls of the bitline in the memory cell area 12. Also, the first silicon nitride sidewall 107 and the silicon oxide sidewalls 142 are formed along sidewalls of the peripheral gates in the anti-fuse area 24. The second peripheral diffusion regions 144 are formed by ion implantation into substrate 62 on both the sides of the right peripheral gate 38. The second peripheral diffusion regions may be activated by a subsequent annealing treatment during formation of the source/drain regions 150/152. The diffusion regions 150/152, together with the gate 38, are incorporated into peripheral transistor 130.

The second silicon nitride sidewall 109 is formed across the peripheral gates 36/38 and the bitline 42. The second silicon nitride sidewall 109 may have a function of preventing conductive material of the bitlines and of the peripheral gates from being oxidized during formation of a SOD (Spin On Dielectric) film (performed later), and may also serve as an insulation film adjacent the SOD.

Referring to FIG. 4B the bitline interlayer 105 and the peripheral gate interlayer 141 are simultaneously formed by forming insulative material 110. The interlayers 105 and 141 may be formed through a SOD film forming step, a SOD annealing step (modifying a SOD into a silicon oxide film), and a planarization step (the planarization may utilize, for example, chemical-mechanical polishing, CMP). The top surface of the material 110 and the top surface of the second silicon nitride 109 are substantially coplanar within one another after the planarization.

Openings 179 are formed for cell contacts 112 (cell contacts are shown in FIG. 4C), and electrically insulative cell contact sidewall material 114 is formed along sidewalls of the openings. Material 114 may comprise, for example, silicon nitride.

Cell contact diffusion regions 70/74 are formed within substrate 62. The cell contact diffusion regions may be activated by an annealing treatment (performed later).

The doped polysilicon lower portions 111 of the cell contacts 112 may be formed, and thereafter openings 180/182 may be formed for the first and second peripheral contact plugs 151/153 (shown in FIG. 4C) in the anti-fuse area. The openings 180 may be utilized for implanting at least some conductivity-enhancing dopant of the source/drain regions of the peripheral transistor 130. The openings 182 extend to the gate electrode of the peripheral transistor 130.

Referring to FIG. 4C, a cell contact material 113 is formed over material 111 to complete fabrication of cell contacts 112. The material 113 may comprise tungsten and/or titanium nitride. In some embodiments cobalt silicide film (not shown) may be formed between the materials 111 and 113.

The first and second peripheral contact plugs 151/153 are formed within openings 180/182 (FIG. 4B). The plugs 151/153 may comprise tungsten and/or titanium nitride.

The wires 52 and 54 are formed. In some embodiments, such wires may comprise tungsten. The wires 54 electrically couple to the gate and source/drain regions of peripheral transistor 130.

Figure 4D:
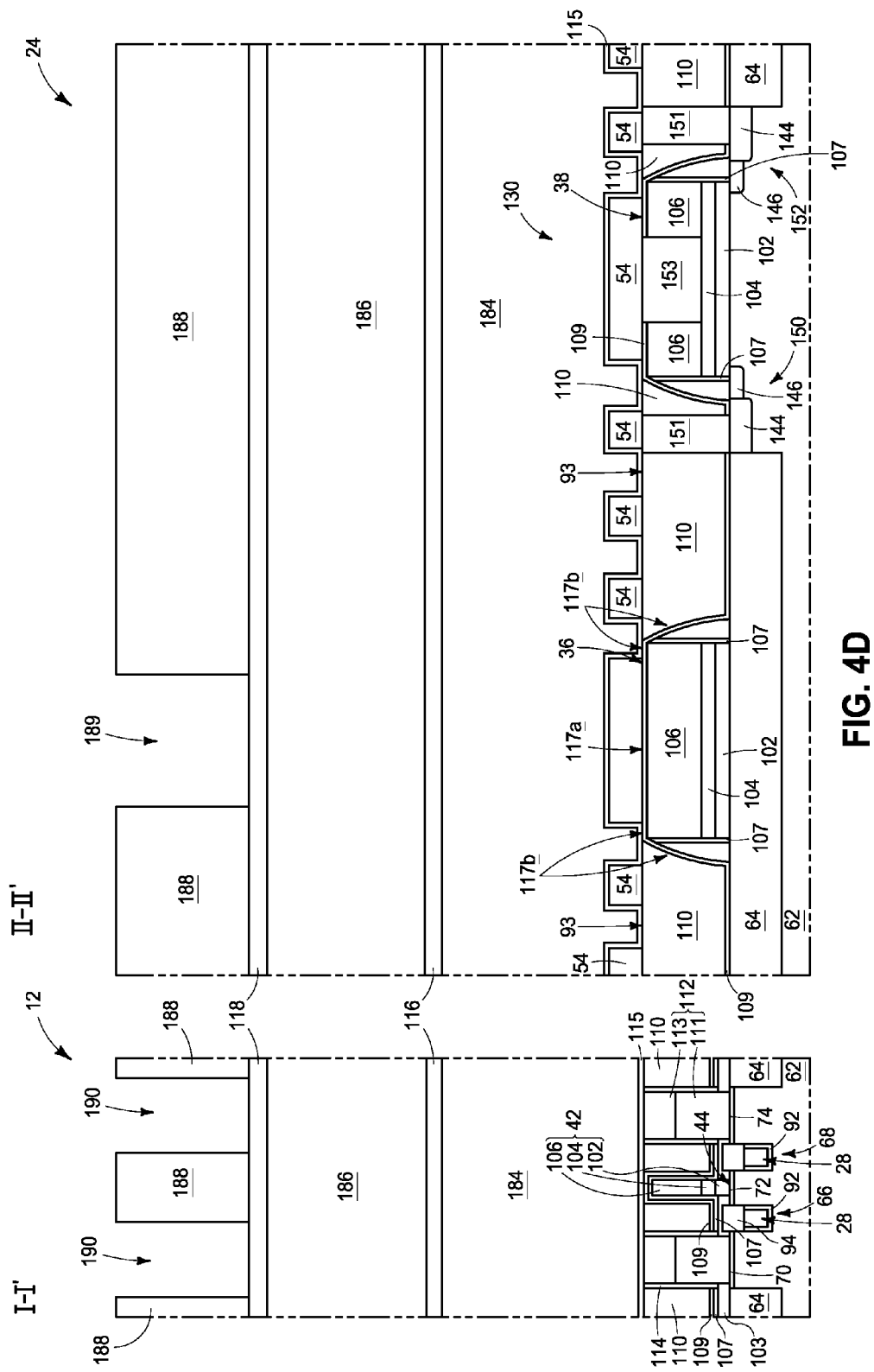

Referring to FIG. 4D, cylinder stopper material 115 (which may be, for example, silicon nitride), first sacrificial material 184 (which may be, for example, silicon oxide), first cylinder support 116 (which may be, for example, silicon nitride), second sacrificial material 186 (which may be, for example, silicon oxide), and second cylinder support 118 (which may be, for example, silicon nitride) are sequentially formed across both the memory cell area 12 and the anti-fuse area 24. A total thickness from a bottom of the cylinder stopper material 115 to a top of the second cylinder support 118 may be within a range of from about 1 micron to about 3 microns, in some example embodiments.

The cylinder stopper material may be resistant to etching by a subsequent HF-containing chemical treatment (for instance, the cylinder stopper material may comprise silicon nitride, and the etch may utilize hydrofluoric acid), and thus the cylinder stopper material may serve as a protective insulating liner resistant to attack by HF-containing chemical solution.

Although materials 184 and 186 are referred to as sacrificial materials in this example embodiment; in other embodiments (for instance, the second example embodiment of FIG. 5), they may remain rather than being removed.

The wires 52/54 are covered with the cylinder stopper material 115 in anti-fuse area 24.

A patterned mask 188 is over support material 118. The patterned mask has an opening 189 extending therethrough to pattern an anti-fuse hole, and has openings 190 extending therethrough to pattern capacitor holes. The mask 188 may comprise, for example, amorphous carbon and/or a silicon film.

Figure 4E:
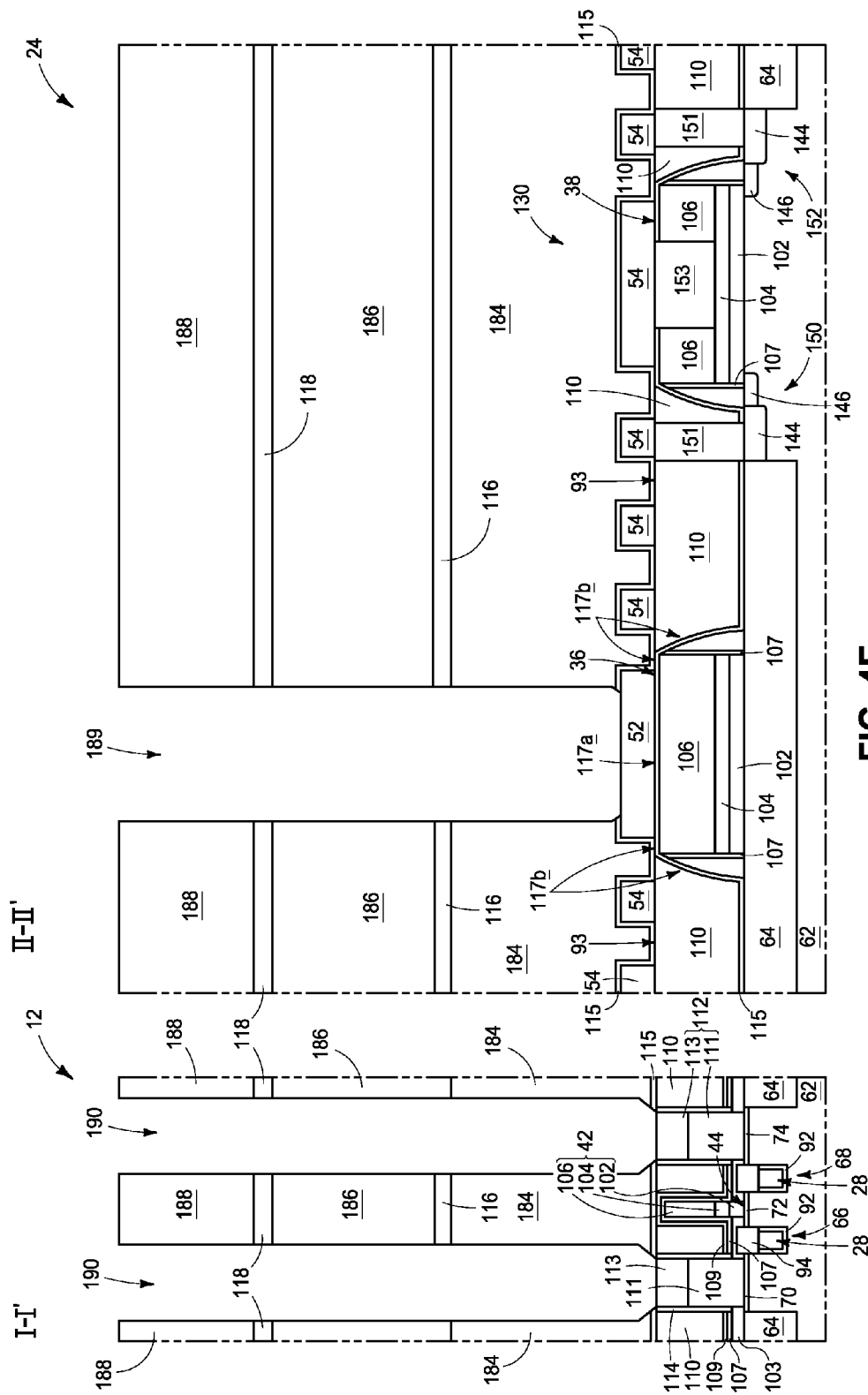

Referring to FIG. 4E, openings 189/190 are extended through materials and structures 184, 116, 186 and 118 to form capacitor holes corresponding to extended openings 190, and to form an anti-fuse hole corresponding to extended opening 189. The openings may be extended, by, for example, dry etching utilizing a fluorocarbon-based gas, such as $C_xF_y$ (wherein x and y are integers of at least 1).

The capacitor holes 190 penetrate the cylinder stopper material 115 and extend to upper surfaces of conductive material 113 of cell contacts 112. The anti-fuse hole 189 penetrates cylinder stopper material 115 and extends to wire 52.

The aspect ratio (hole depth/hole diameter) of the capacitor holes may be about 100. When an α-C (amorphous carbon) film is used as a mask in processing for forming such a deep hole, the mask may be heavily damaged. Accordingly, a silicon film may be employed. The silicon film may comprise polycrystalline silicon and/or amorphous silicon.

The capacitor holes 190 may have substantially circular shapes with diameters of, for example, about 15 nm; and the anti-fuse hole 189 may have a substantially rectangular shape with a size of, for example, about 50 nm by about 150 nm. The opening areas of the capacitor hole and the anti-fuse hole may be different from each other such that one of the opening areas is 100 or more times greater than the other.

Figure 4F:
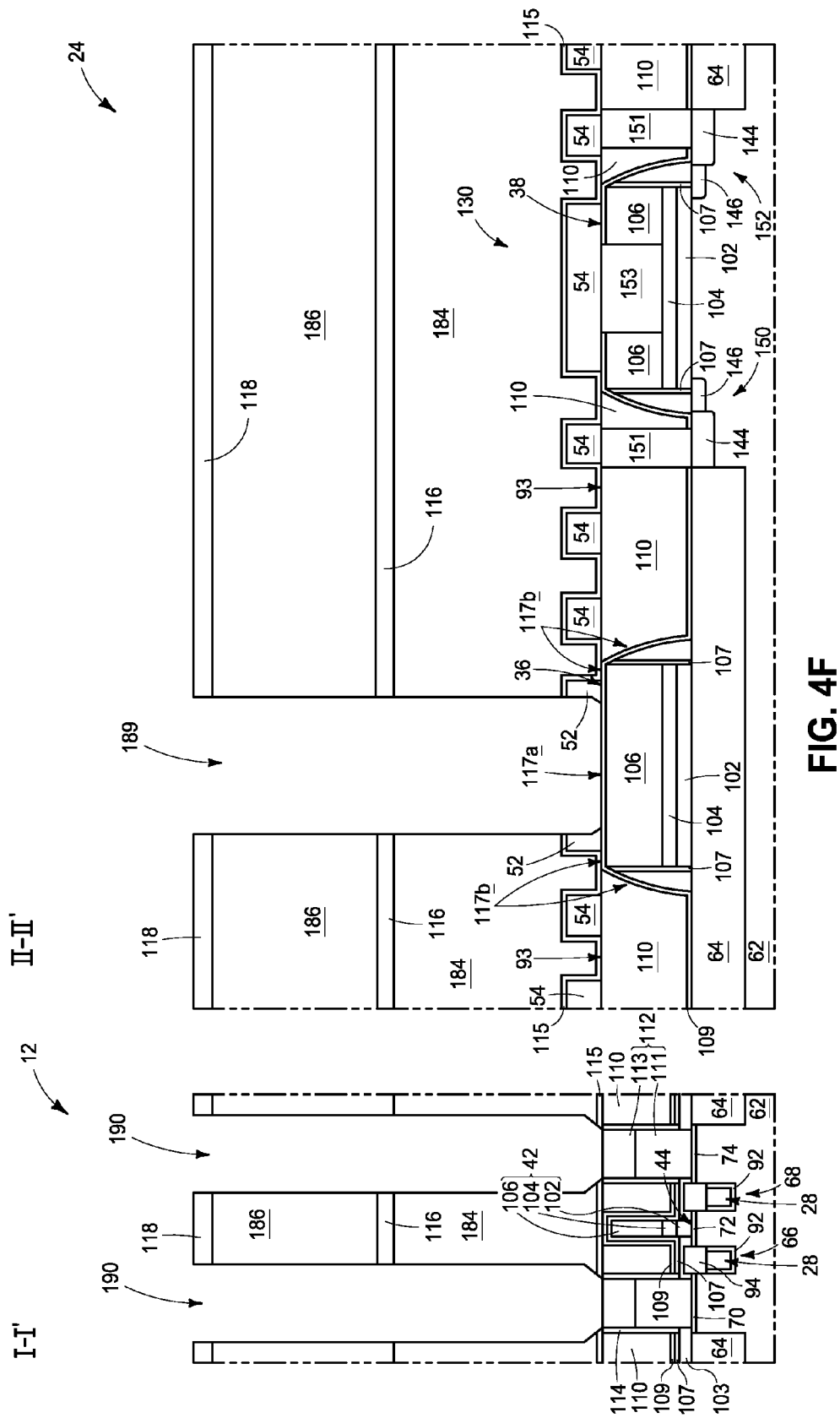

Referring to FIG. 4F, the masking material 188 (FIG. 4E) is removed. For instance, silicon may be reactively removed utilizing chlorine ions in a dry etch. An example etching gas may comprise a mixture of $Cl_2$, $BCl_3$, and $O_2$. The chlorine ions may reach the bottom of the wide anti-fuse hole so that the wire 52 is etched. In some embodiments, the chlorine ions may remove regions consisting of, or consisting essentially of, silicon, tungsten, and/or tungsten nitride.

Figure 4G:
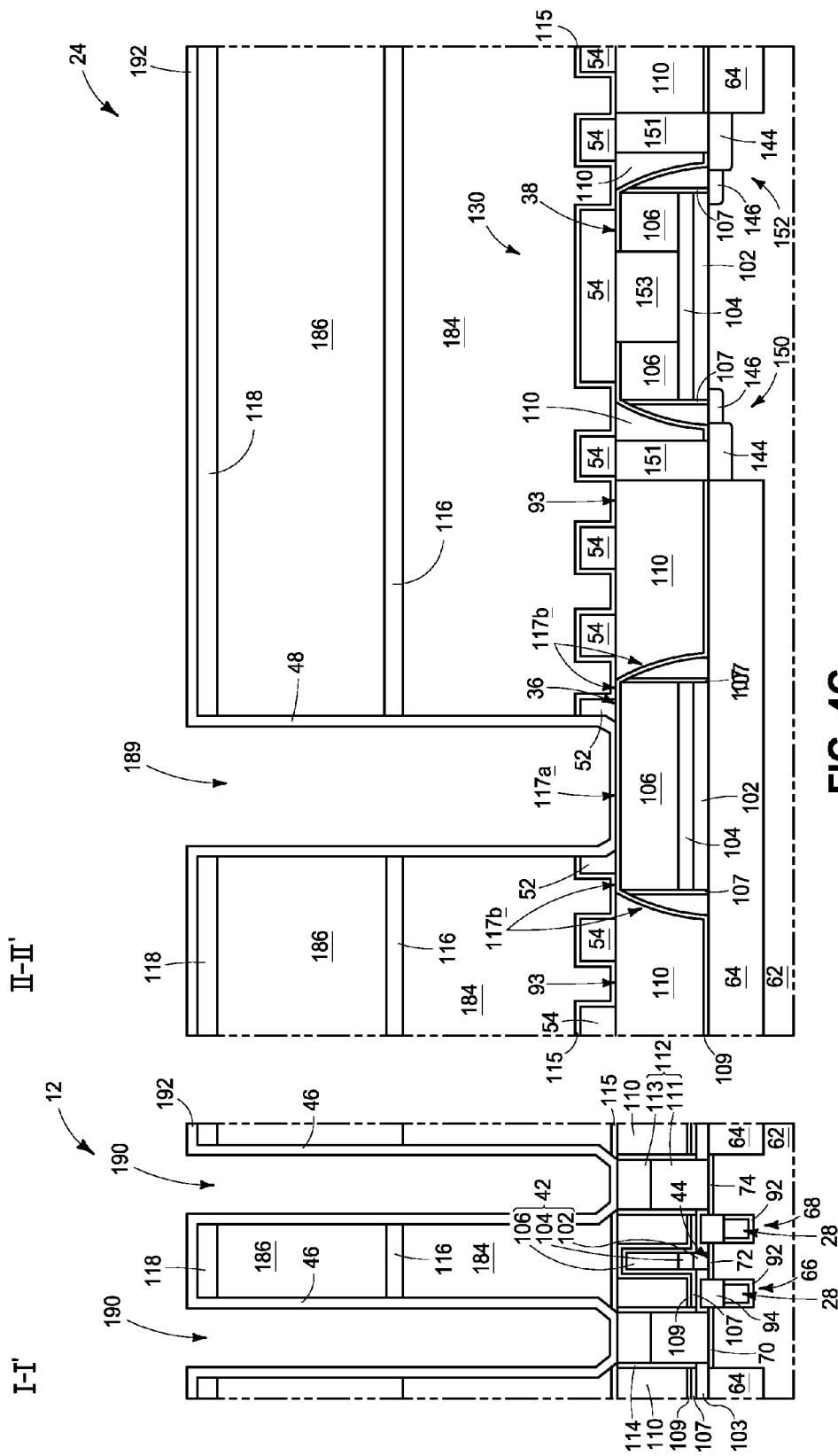

Referring to FIG. 4G, a conductive material 192 is formed within openings 189/190 to line the openings, and the material 192 extends across a surface of cylinder support structure 118. The material 192 may comprise, for example, titanium nitride; and may be formed to any suitable thickness, such as, for example, a thickness of about 7 nm.

Figure 4H:
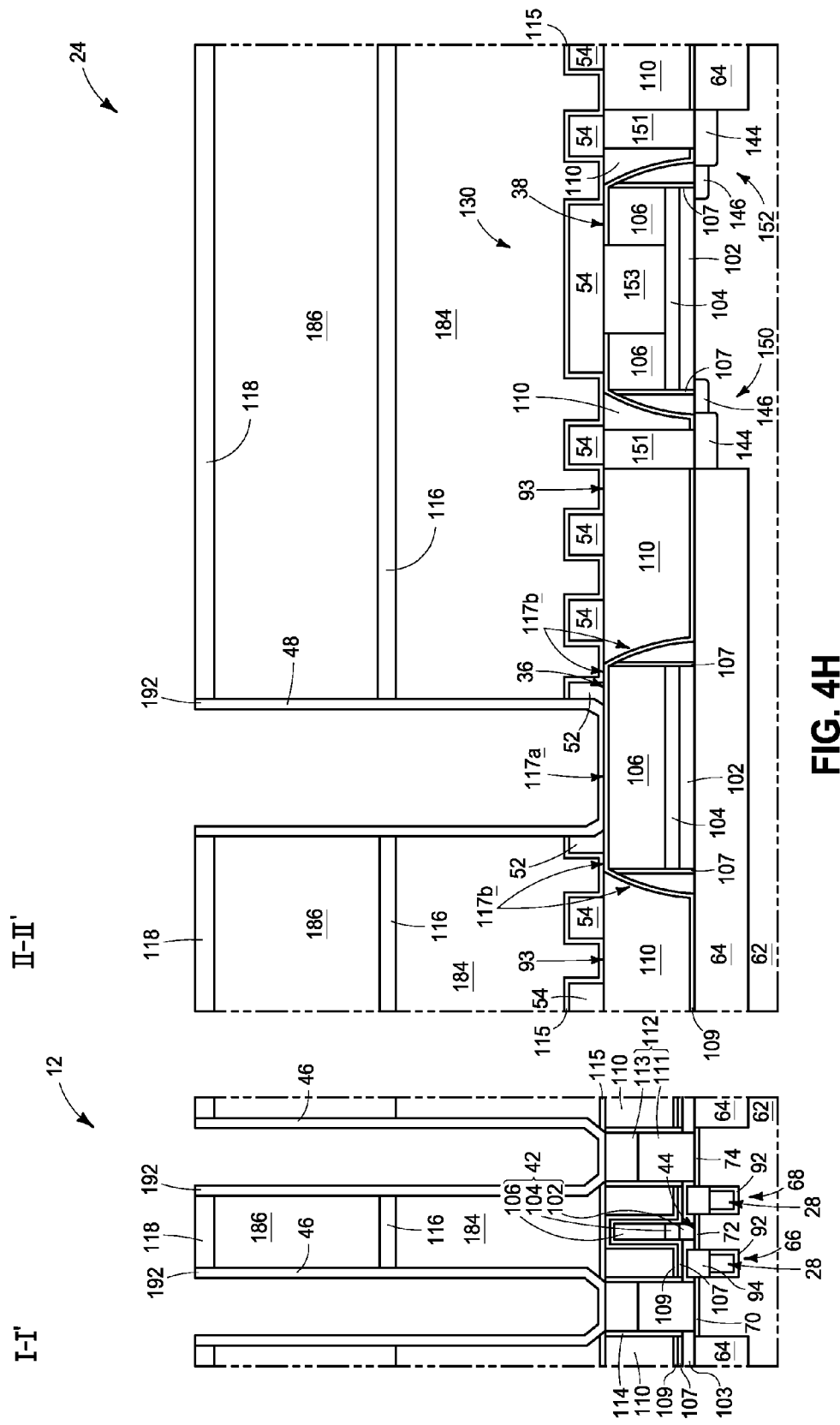

Referring to FIG. 4H, the conductive material 192 is etched back to form lower capacitor electrodes 46 and lower anti-fuse electrode 48.

Figure 4I:
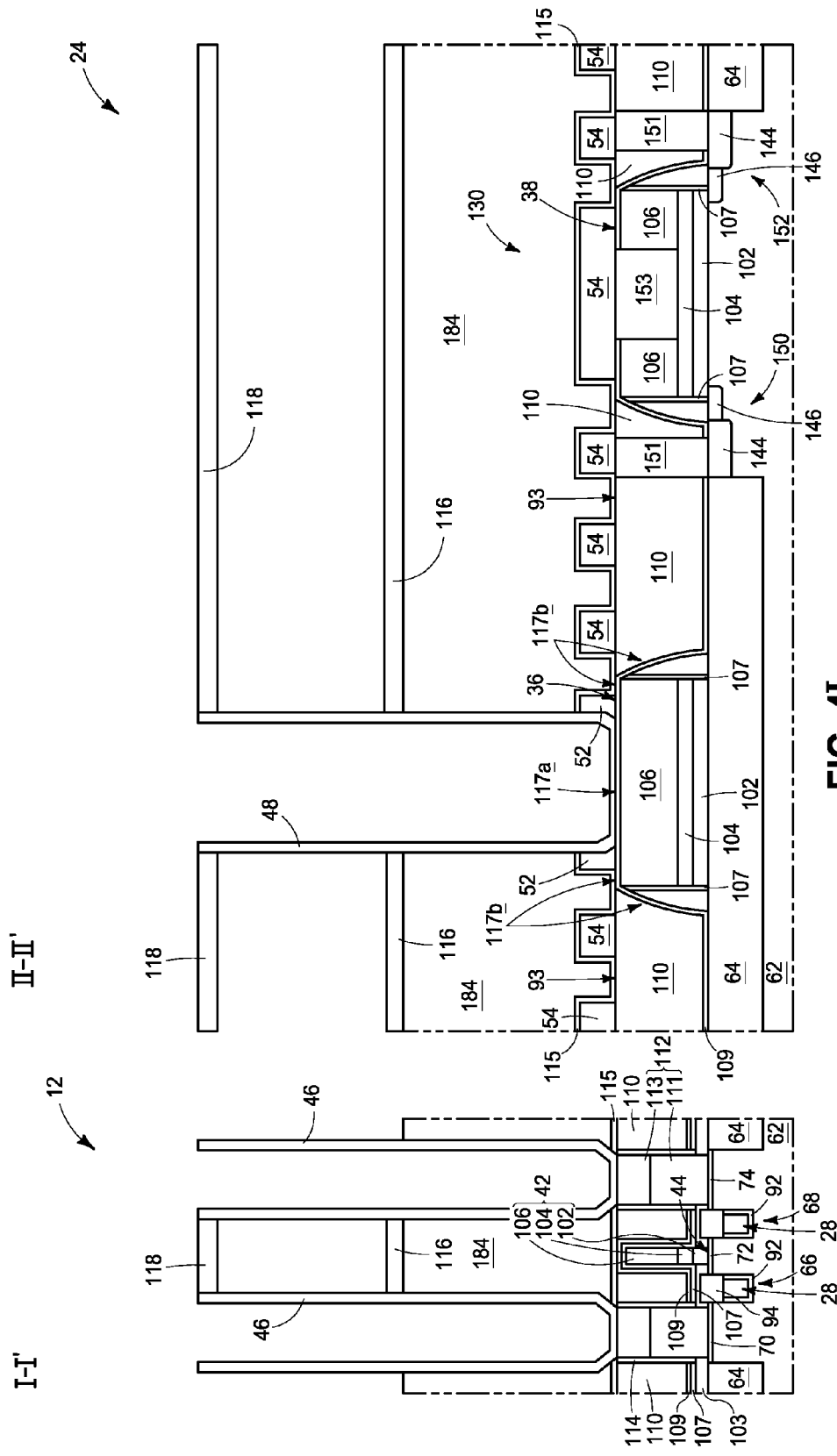

Referring to FIG. 4I, material 186 (FIG. 4H) is removed. Portions of material 186 are removed from memory cell area 12, and from regions of peripheral area 24. The removed region of material 186 may surround the counter anti-fuse plate 60 (FIG. 3) in the anti-fuse area.

After selectively removing part of the cylinder support material 118 using a first dry etching, the material 186 may be removed by a dip in an HF-containing chemical solution. The HF (Hydrofluoric acid) chemical treatment may selectively etch silicon oxide relative to titanium nitride and silicon nitride. After the HF chemical treatment, a part of the first cylinder support 116 is removed by using a second dry etching. If desired, α-C (amorphous carbon) films, not shown, may be used in one or more masks to protect some regions during both of the dry etchings.

Figure 4J:
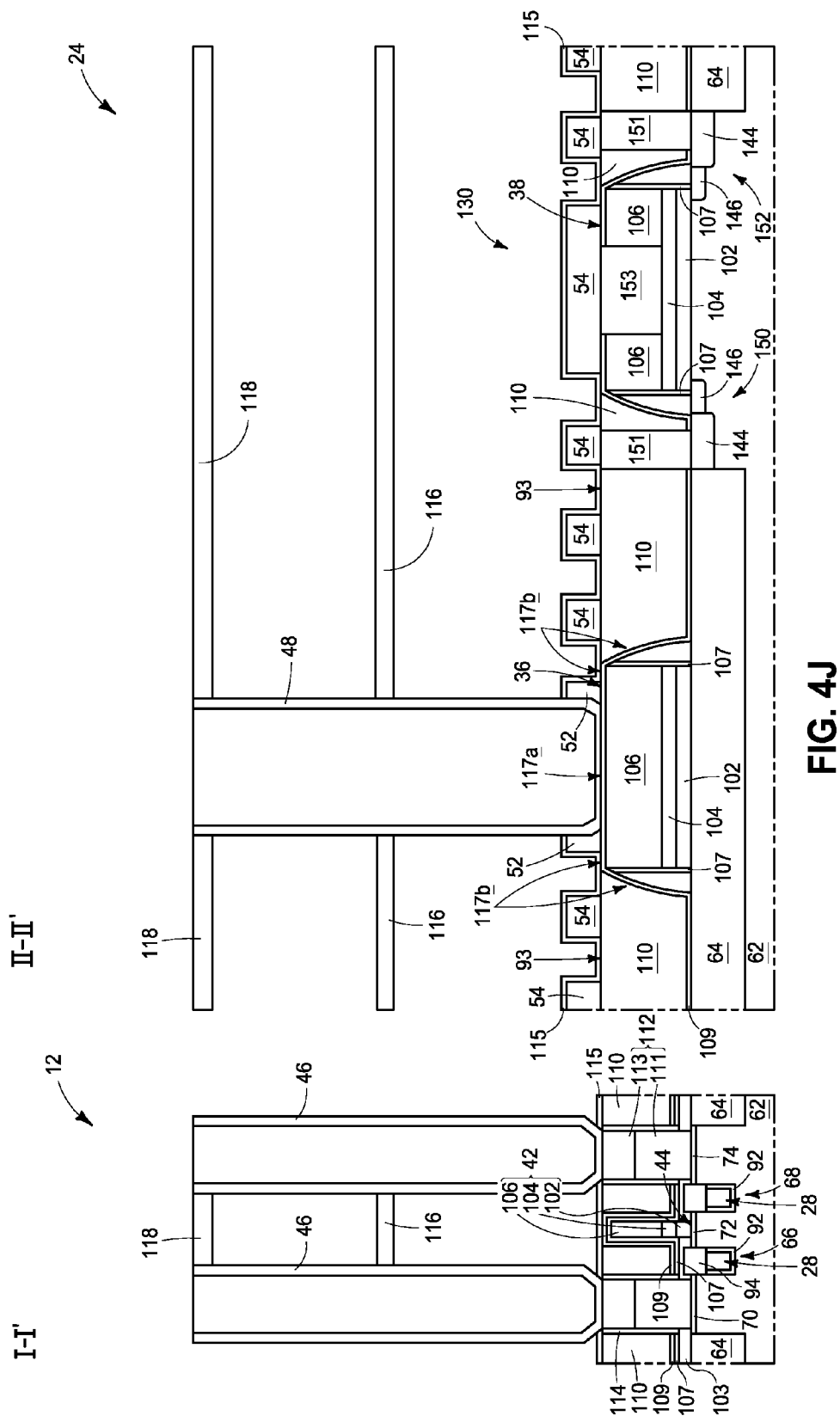

Referring to FIG. 4J, material 184 (FIG. 4I) is removed. Portions of material 184 are removed from memory cell area 12, and from regions of peripheral area 24. The material 184 may be removed by a dip in an HF-containing chemical solution.

The lower capacitor electrodes 46 and the lower anti-fuse electrode 48 are now completed, and have upwardly-opening container shapes. The HF (Hydrofluoric acid) chemical treatment may selectively etch silicon oxide relative to titanium nitride, tungsten and silicon nitride. Conductive materials 104/52/54 may be protected by silicon nitride materials 109/115 during etching with HF. Thus, even if pinholes are present in the lower anti-fuse electrode 48, the silicon nitride materials 109/106 will protect underlying materials. Accordingly, soak defects caused by detrimental HF etching in undesired locations may be avoided.

Figure 4K:
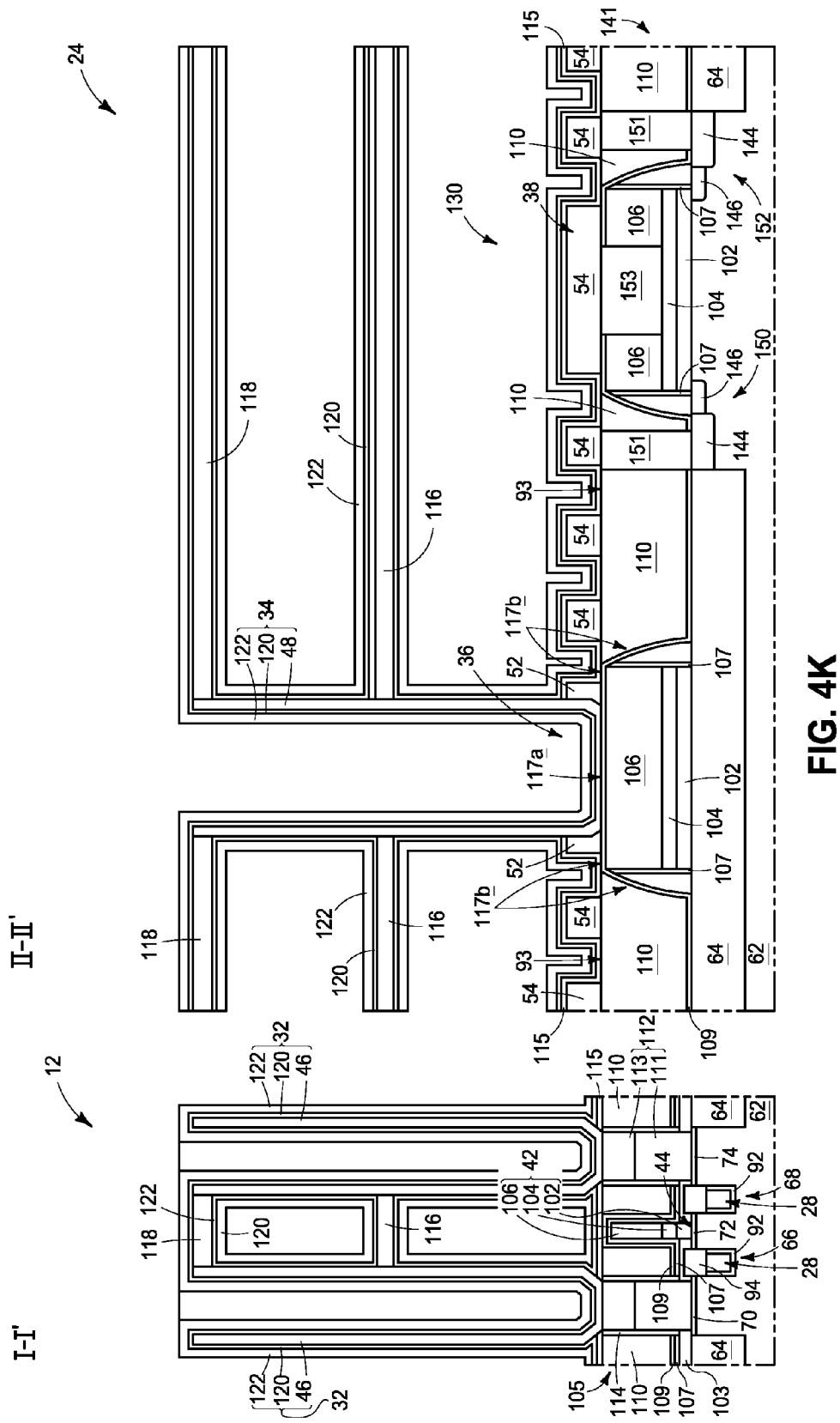

Referring to FIG. 4K, dielectric material 120 and upper electrode material 122 are formed across the memory cell area 12 and anti-fuse area 24. The materials 120 and 122, together with lower capacitor electrodes 46, form cell capacitors 32 of memory cells; and the materials 120 and 122, together with lower anti-fuse electrode 48, form an anti-fuse capacitor 34 of an anti-fuse structure.

Material 120 may comprise, for example, metal oxide containing one or more of Ti (titanium), Zr (zirconium) and Al (aluminum) and having, for example, a film thickness of at least about several nanometers. Material 122 may comprise, for example, titanium nitride; and may have, for example, a film thickness of at least about 5 nm.

Referring to FIG. 4L, the plates 60/124 are formed from the materials 119, 121 and 123 described previously. The plate 124 may be referred to as a counter capacitor plate in memory area 12, and the plate 60 may be referred to as a counter anti-fuse plate in anti-fuse area 24. The wiring patterns comprising the first, second and third metals 126/127/128 are formed over the counter capacitor plate and the counter anti-fuse plate.

Second Example Embodiment

Figure 5:
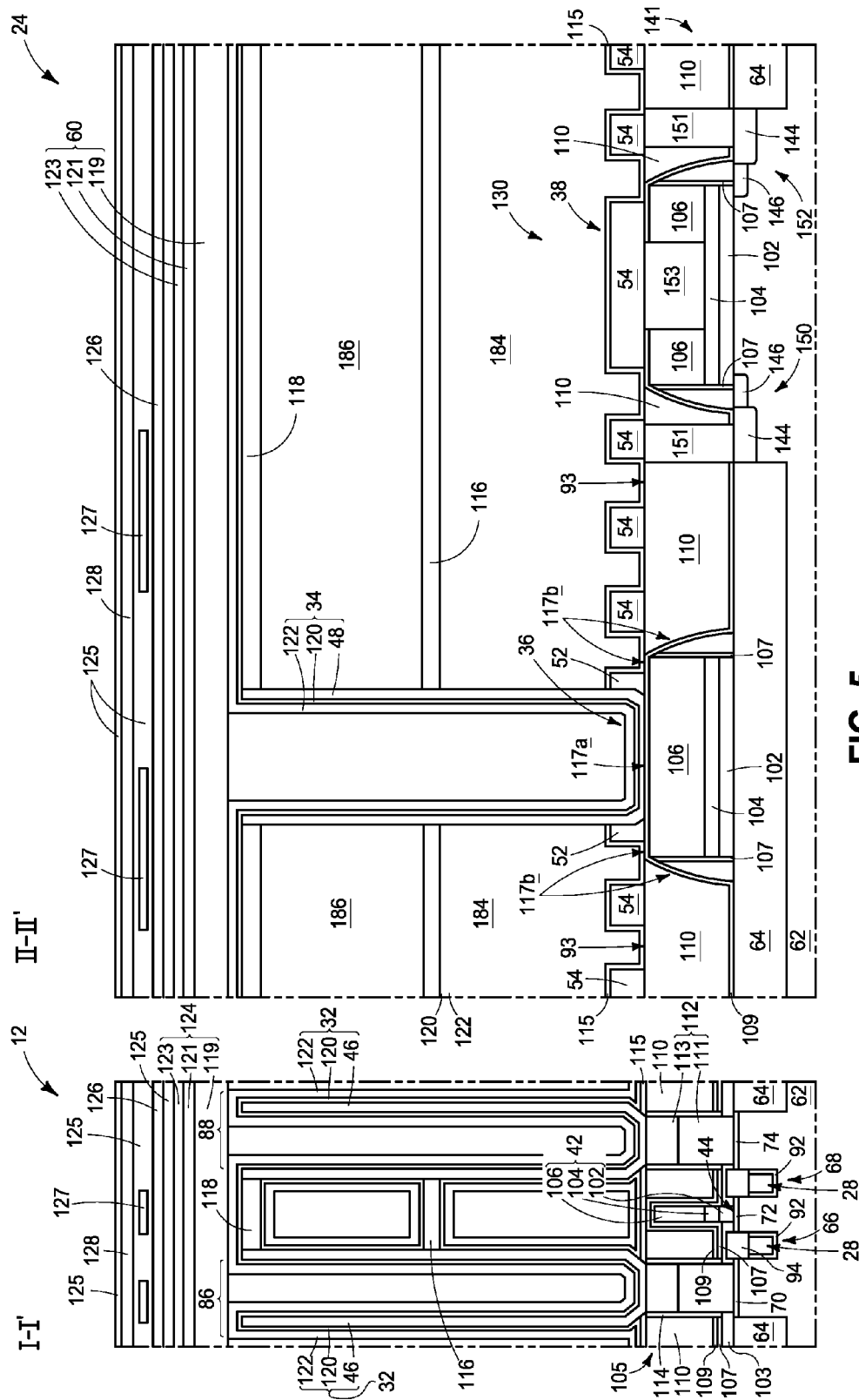
FIG. 5 illustrates cross-sectional views along the lines I-I' of FIG. 2 and II-II' of FIG. 3 in accordance with another example embodiment.

In the first embodiment, the first and second sacrificial materials 184/186 (FIG. 4H) were removed from anti-fuse area 24 with the HF-containing chemical solution. In a second embodiment, the first and second materials 184/186 are not removed from the peripheral region. For example, photoresist material may be utilized as a protective mask over anti-fuse area 24 during etching of materials 184/186 from the memory cell area 12. The protective mask may cover some or all of the peripheral area 22 (FIG. 1). Leaving materials 184/186 over the anti-fuse area 24 during HF etching of the memory region may further alleviate risk of HF-induced damage near an anti-fuse. FIG. 5 shows views along I-I' of FIG. 2 and II-II' of FIG. 3. The second example embodiment is thus illustrated utilizing FIGS. 1, 2, 3, and 5.

Third Example Embodiment

The third embodiment is different from the first embodiment in the shapes of the anti-fuse portions. The third embodiment is described with reference to FIGS. 6A-E, using the sections I-I' of FIG. 2 and II-II' of FIG. 3. The third embodiment may be considered to be described utilizing FIGS. 1, 2, 3, and 6A-E; with FIG. 6E showing a finished structure.

Figure 6A:
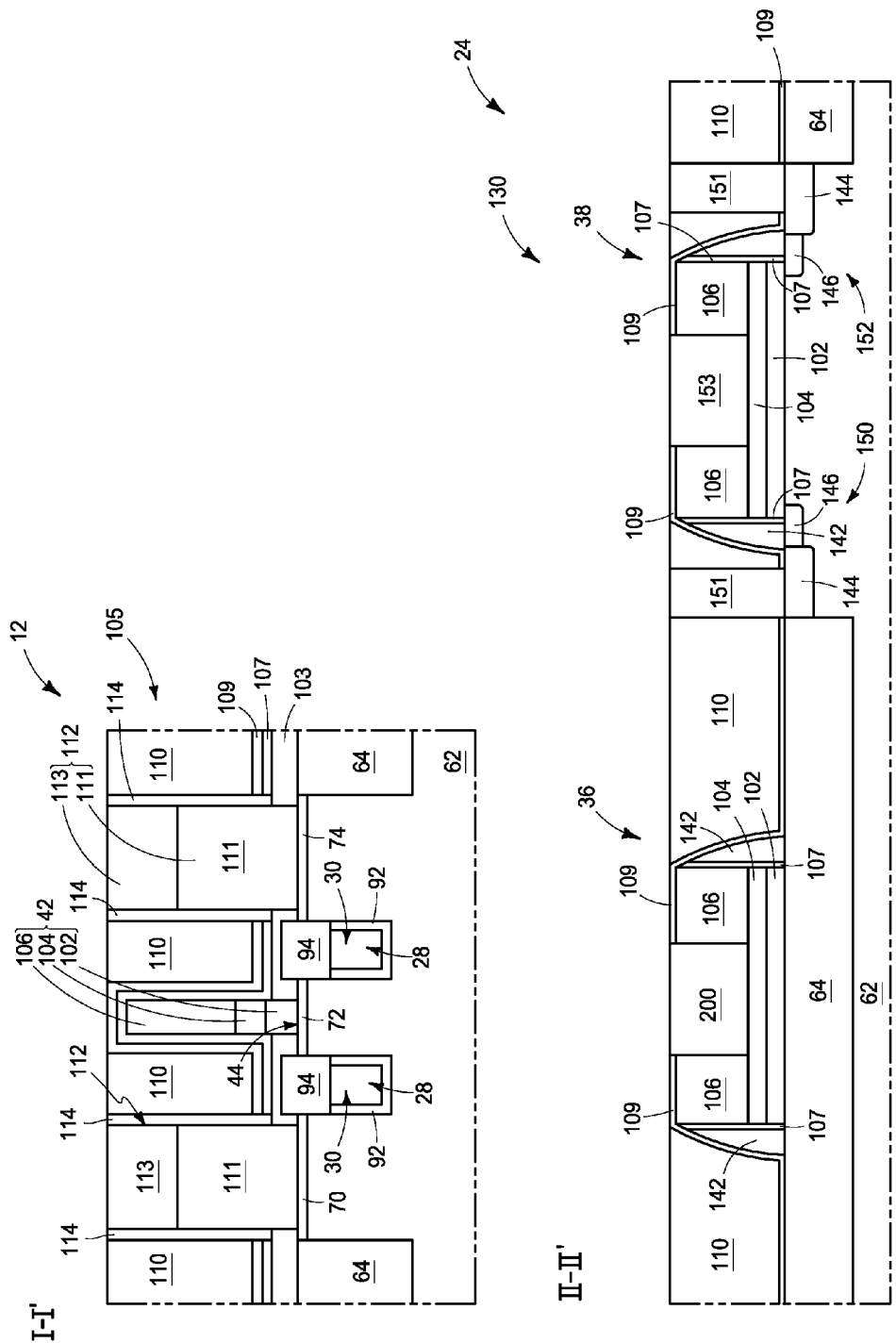
FIGS. 6A-E illustrate processing stages of another example embodiment method of forming example embodiment structures.
Figure 6B:
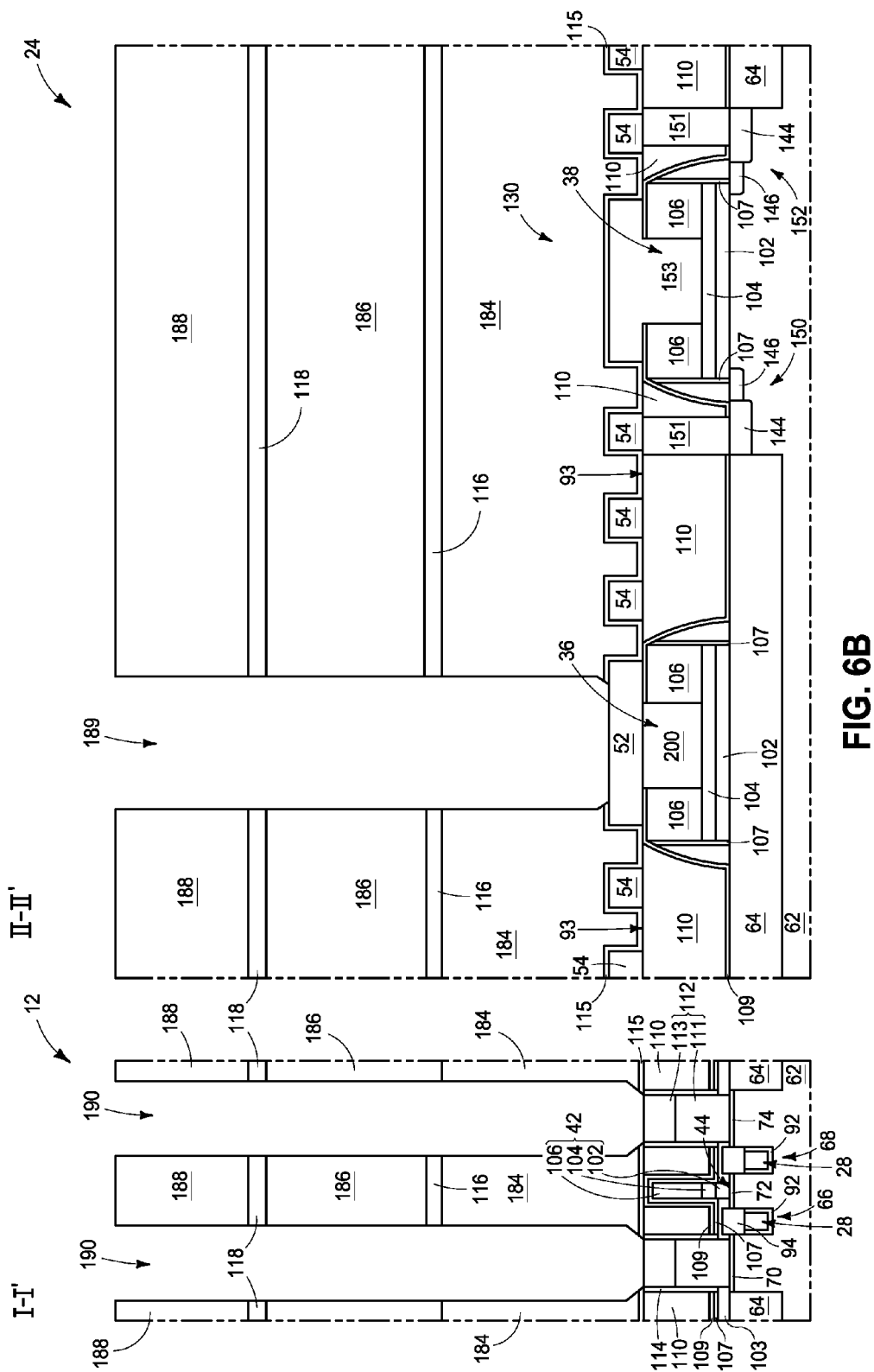
Figure 6C:
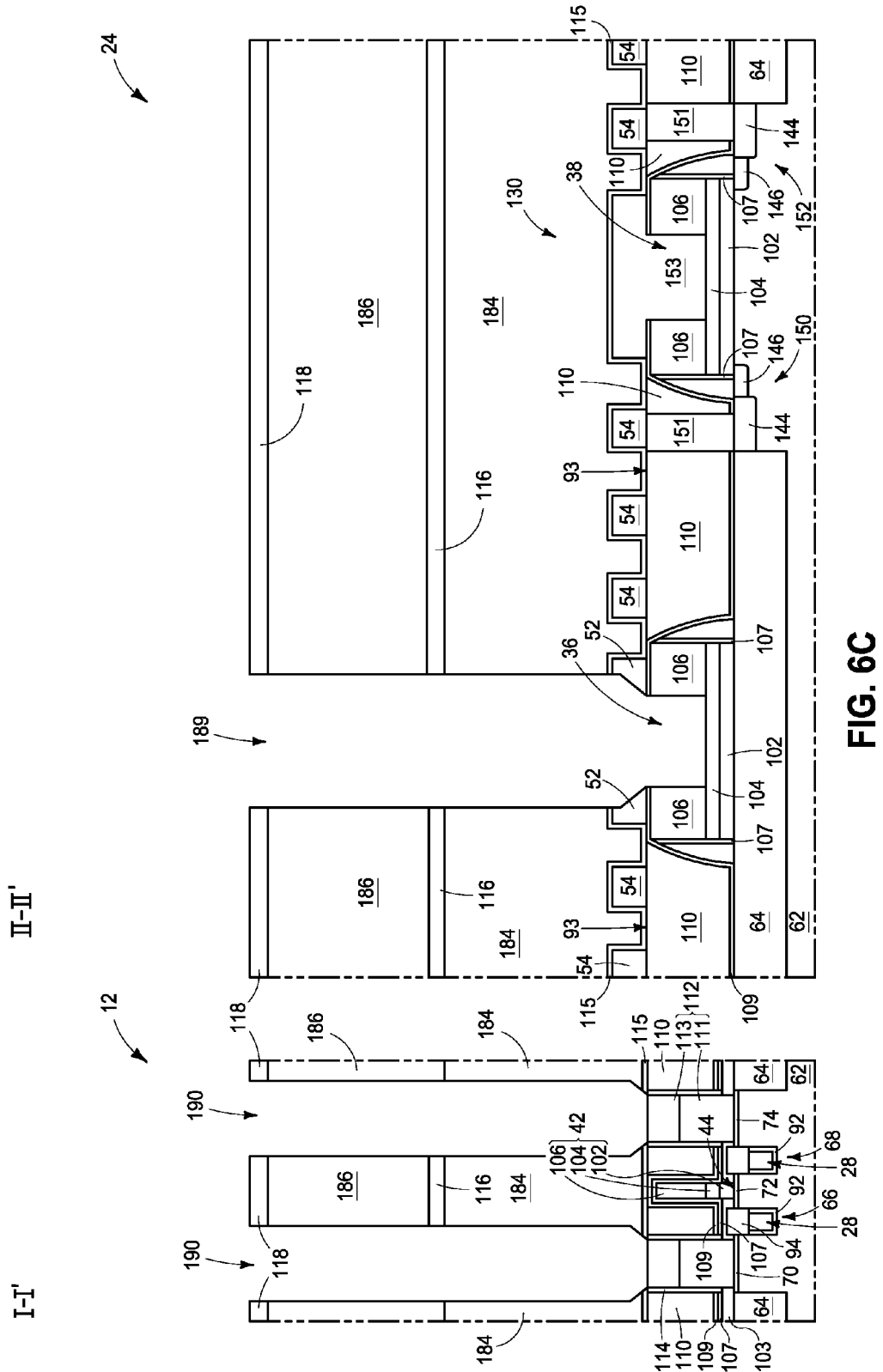
Figure 6D:
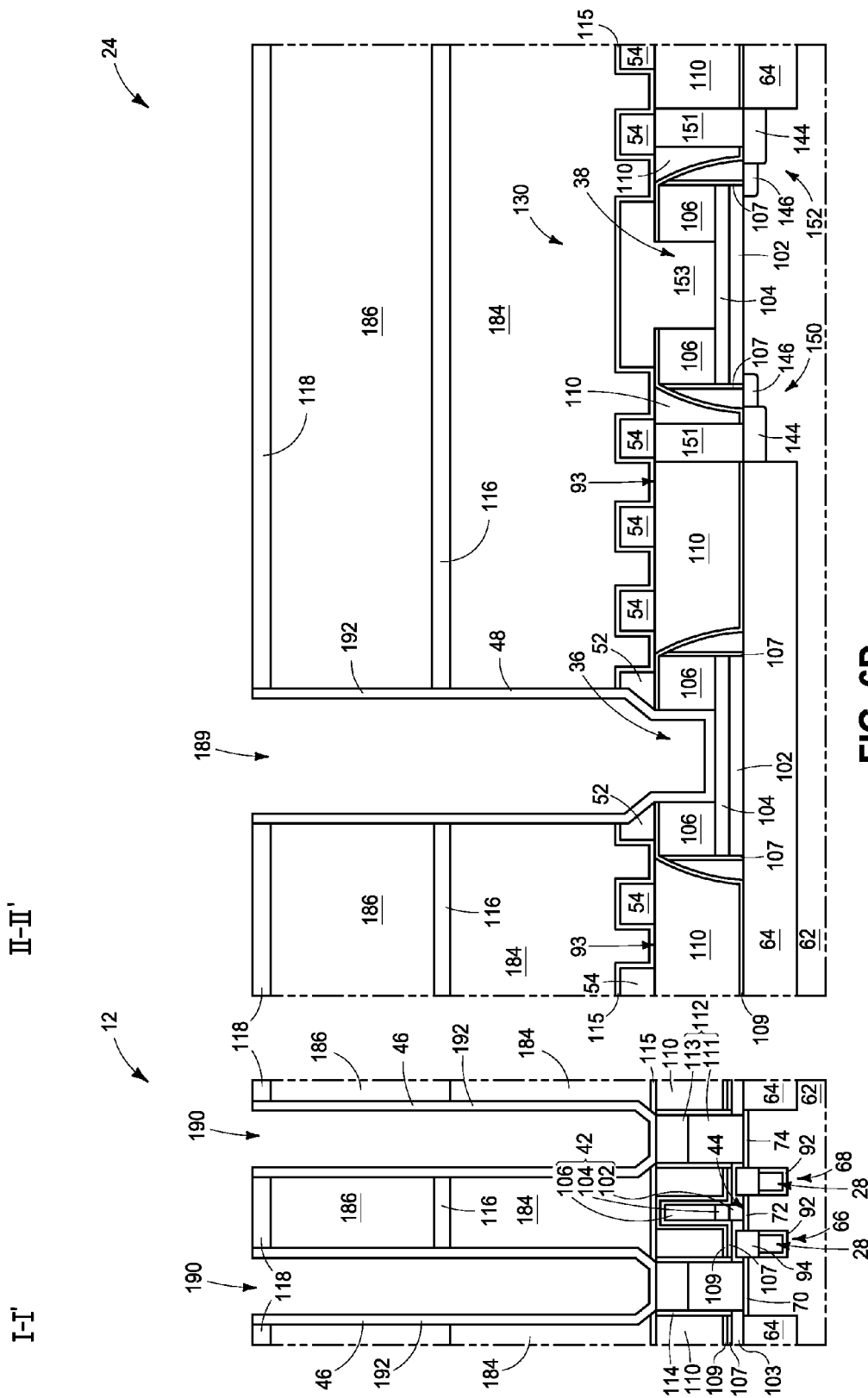
Figure 6E:
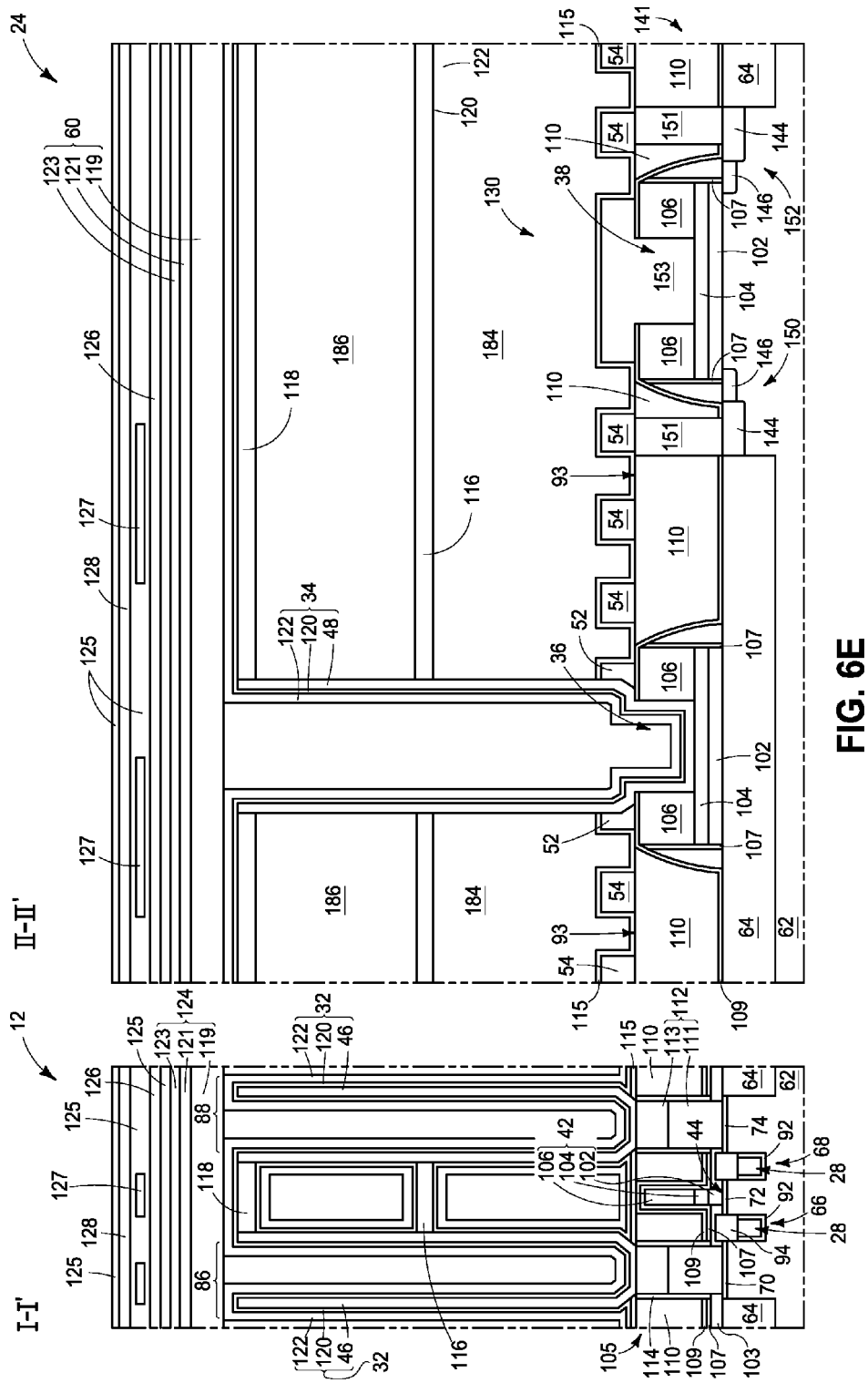

Referring to FIG. 6E, the lower anti-fuse electrode 48 in the anti-fuse area 24 penetrates through wire 52, and also through materials 106 and 109 to make direct contact with electrically conductive material 104 of peripheral gate 36. Accordingly, a high voltage may be applied to conductive materials 102/104 of peripheral gate 36 to short-circuit the anti-fuse 34. In some embodiments, the construction of FIG. 6E may be considered to have a hole extending through a covering material 109 and an insulative capping material 106, with the lower anti-fuse electrode 48 being elongated to reach a conductive region of gate 36 through such hole.

A manufacturing method for fabricating example structures of the third embodiment is described with reference to FIGS. 6A-E. The I-I' views in FIGS. 6A-E are along the line I-I' of FIG. 2, and the II-II' views are along the line II-II' of FIG. 3. In FIG. 6A, the scale of the sectional view along I-I' is increased relative to the sectional view along II-II'.

Referring to FIG. 6A, a construction is shown at a processing stage intermediate FIGS. 4B and 4C; and is at a processing stage subsequent to formation of the cell contacts 112. A third peripheral contact plug 200 is formed in addition to the peripheral contact plugs 151 and 153, with the third peripheral contact plug being in contact with the electrically conductive material 104 of the peripheral gate 36. An opening shape of the third peripheral contact plug 200 may be set to have a dimension smaller than a dimension of a lower anti-fuse electrode 48 (formed later) along the cross-section II-II'. For instance, when the lower anti-fuse electrode has a substantially rectangular shape having a size of about D2a× D2b=150 nm×50 nm, the third peripheral contact may have a substantially rectangular shape having a size of D3a×D3b (not shown, but along directions analogous to D2a and D2b of FIG. 3), where D3a<150 nm and/or D3b<50 nm. The first, second and third peripheral contact plugs 151/153/200 may be formed simultaneously with one another, and during fabrication of conductive plugs 113 in the memory cell area 12. The first, second and third peripheral contact plugs 151/153/ 200 may comprise common structural constituents as one another, and as conductive plugs 113; and in some embodiments may all comprise tungsten over titanium nitride (i.e. W/TiN).

Referring to FIG. 6B, the construction of the third example embodiment is shown at a processing stage analogous to that of FIG. 4E. A wiring pattern 52 of the first group is connected to the lower anti-fuse electrode to operate as a conductive pad of the lower anti-fuse electrode. The wires 54 of the second group are connected to the source/drain regions 150/152 through first peripheral contact plugs 151, and to the peripheral gate 38 through second peripheral contact plug 153.

The wire 52 of the first group covers the entire uppermost surface of the third peripheral contact 200.

The cylinder stopper material 115 is formed; as are the support structures 116/118 and the sacrificial materials 184/ 186.

The mask 188 is formed, and is utilized to pattern capacitor holes 190 and anti-fuse hole 189. The holes may be formed with similar, and in some embodiments identical, processing to that described above with reference to FIG. 4E Referring to FIG. 6C, the mask 188 (FIG. 6B) is removed. Such removal may be accomplished with processing described above with reference to FIG. 4F. In contrast to the processing stage of FIG. 4F, that of FIG. 6C has the anti-fuse hole 189 extending through material 106 on material 104. In some embodiments, the etching utilized to extend anti-fuse hole 189 (for instance, an etch utilizing a gaseous mixture of $Cl_2$, $BCl_3$ and $O_2$) may etch partially into material 104.

Referring to FIG. 6D, lower electrode material 192 is formed within openings 189 and 190, and patterned to form lower capacitor electrodes 46 and lower anti-fuse electrode 48. The processing stage of FIG. 6D is similar to that of FIG. 4H, and may be formed with similar processing. The material 192 may comprise titanium nitride in some embodiments, and may have a thickness within a range of from about 5 nanometers to about 10 nanometers. The lower anti-fuse electrode 48 is directly against the conductive material 104 of peripheral gate 36. In some embodiments, material 104 may comprise one or both of tungsten and tungsten nitride.

In processing following that of FIG. 6D, a cell capacitor and a fuse capacitor may be formed to obtain the construction shown in FIG. 6E.

The electronic devices and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric", "insulative", and "insulating" may be utilized to describe materials having insulative electrical properties. The terms are considered synonymous in this disclosure. The utilization of the term "dielectric" in some instances, the term "insulative" in other instances, and the term "insulating" in yet other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a semiconductor construction comprising an interlayer insulating material (e.g., 110) extending across a memory region (e.g., 12) and peripheral region (e.g., 22, 24) of a substrate (e.g., 62). A memory cell (e.g., 26) is within the memory region, and a fuse capacitor (e.g., 34) is within the peripheral region. A covering material (e.g., 109) is between the fuse capacitor and the interlayer insulating material in contact with the fuse capacitor and the interlayer insulating material. The covering material is of a different composition relative to the interlayer insulating material.

Some embodiments include a semiconductor construction which includes a semiconductor substrate (e.g., 62), an interlayer insulating material (e.g., 110) over the semiconductor substrate, and a plurality of memory cells (e.g., memory cells 26) supported by the substrate. Each memory cell includes a cell transistor (e.g., 66, 68), a conductive plug (e.g. 112) and a cell capacitor (e.g., 32). The cell transistor comprises source and drain regions (e.g., 70, 72, 74) extending into the semiconductor substrate. The conductive plug extends through the interlayer insulating material. The conductive plug is in electrical contact with one of the source and drain regions and with the cell capacitor. The semiconductor construction includes at least one anti-fuse comprising a fuse capacitor (e.g., 34). The fuse capacitor is supported by the semiconductor substrate. The semiconductor construction includes a covering material (e.g., 109) between the fuse capacitor and the interlayer insulating material in contact with the fuse capacitor and the interlayer insulating material. The covering material is of a different composition than the interlayer insulating material.

Some embodiments include a semiconductor construction comprising a semiconductor substrate (e.g., 62) having a memory cell region (e.g., 12) and a peripheral region (e.g., 22, 24) adjacent the memory cell region. At least one memory cell (e.g., 26) is in the memory cell region, and the memory cell comprises a cell transistor (e.g., 66, 68) having a pair of source and drain regions (e.g., 70, 72, 74), comprises a cell capacitor (e.g., 32) in electrical contact with one of the source and drain regions, and comprises a bitline (e.g., 42) in electrical contact with the other of the source and drain regions. A conductive region (e.g., 102/104) is in the peripheral region, and the conductive region includes a top surface. An interlayer insulating material (e.g., 110) extends across the memory cell and the peripheral regions, and is between the bitline and the conductive region. A covering material (e.g., 109) covers the top surface of the conductive region. The covering material is different in composition than the interlayer insulating material. A fuse capacitor (e.g., 34) is over the covering material.

Some embodiments include a semiconductor construction comprising a semiconductor substrate (e.g., 62) which includes a memory cell region (e.g., 12) and a peripheral region (e.g., 22, 24) adjacent the memory cell region. A memory cell (e.g., 26) is in the memory cell region and comprises a cell transistor (e.g., 66, 68) including a pair of source and drain regions (e.g., 70, 72, 74), a cell capacitor (e.g., 32) in electrical contact with one of the source and drain regions, and a bitline (e.g., 42) in electrical contact with the other of the source and drain regions. A peripheral transistor (e.g., 38) is in the peripheral region and comprises a gate electrode (e.g., 102/104) having common structural constituents as the bitline. A conductive region (e.g., 36) is in the peripheral region and has common structural constituents as the bitline. An interlayer insulating material (e.g., 110) is within the memory cell and peripheral regions, and extends laterally between the bitline, the gate electrode and the conductive region. A first insulation material (e.g., 106) covers at least the conductive region. The first insulation material is different in composition relative to the interlayer insulating material. A fuse capacitor (e.g., 34) is over the first insulation material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
   an interlayer insulating material extending across a memory region and peripheral region of a substrate;
   a memory cell within the memory region, and a fuse capacitor within the peripheral region;
   a covering material between the fuse capacitor and the interlayer insulating material and being in contact with the fuse capacitor and the interlayer insulating material; the covering material being of a different composition relative to the interlayer insulating material;
   wherein the covering material comprises a first surface in contact with a bottom surface of the fuse capacitor and a second surface offset from the first surface and in contact with the interlayer insulating material; and
   wherein the interlayer insulating material comprises a main surface and the first surface of the covering material is substantially coplanar with the main surface of the interlayer insulating material.

2. The construction of claim 1, wherein the interlayer insulating material comprises silicon oxide and the covering material comprises silicon nitride.

3. A semiconductor construction, comprising:
   a semiconductor substrate;
   an interlayer insulating material over the semiconductor substrate;
   a plurality of memory cells supported by the semiconductor substrate; each memory cell including a cell transistor, a conductive plug and a cell capacitor; the cell transistor comprising source and drain regions extending into the semiconductor substrate; the conductive plug extending through the interlayer insulating material; the conductive plug being in electrical contact with one of the source and drain regions and with the cell capacitor;
   at least one anti-fuse comprising a fuse capacitor, the fuse capacitor being supported by the semiconductor substrate;
   a covering material between the fuse capacitor and the interlayer insulating material and being in contact with the fuse capacitor and the interlayer insulating material, the covering material being of a different composition relative to the interlayer insulating material;
   wherein the covering material comprises a first surface in contact with a bottom surface of the fuse capacitor and a second surface offset from the first surface and in contact with the interlayer insulating material; and
   wherein the interlayer insulating material comprises a main surface and the first surface of the covering material is substantially coplanar with the main surface of the interlayer insulating material.

4. A semiconductor construction, comprising:
a semiconductor substrate;
an interlayer insulating material over the semiconductor substrate;
a plurality of memory cells supported by the semiconductor substrate; each memory cell including a cell transistor, a conductive plug and a cell capacitor; the cell transistor comprising source and drain regions extending into the semiconductor substrate; the conductive plug extending through the interlayer insulating material; the conductive plug being in electrical contact with one of the source and drain regions and with the cell capacitor;
at least one anti-fuse comprising a fuse capacitor, the fuse capacitor being supported by the semiconductor substrate;
a covering material between the fuse capacitor and the interlayer insulating material and being in contact with the fuse capacitor and the interlayer insulating material, the covering material being of a different composition relative to the interlayer insulating material; wherein the covering material comprises a first surface in contact with a bottom surface of the fuse capacitor and a second surface offset from the first surface and in contact with the interlayer insulating material; and
a conductive wiring layer in contact with a part of the first surface of the covering material.

5. The construction of claim 4, wherein the conductive wiring layer is elongated over the first surface of the covering material beyond the fuse capacitor.

6. The construction of claim 5, wherein the conductive wiring layer comprises tungsten, and is on a pair of opposing sides of the fuse capacitor along a cross-section.

7. The construction of claim 5, wherein the interlayer insulating material comprises silicon oxide, and the covering material comprises silicon nitride.

8. The construction of claim 3, further comprising a conductive region between the semiconductor substrate and the first surface of the covering material.

9. The construction of claim 8, wherein the conductive region comprises a polysilicon layer, a metal silicide layer on the polysilicon layer and a metal layer between the metal silicide layer and the covering material.

10. The construction of claim 8, further comprising a trench isolation region embedded in the semiconductor substrate, the conductive region being over the trench isolation region.

11. The construction of claim 8, wherein the covering material includes a hole extending therethrough to expose a part of the conductive region, and the fuse capacitor is elongated to reach the part of the conductive region through the hole.

12. A semiconductor construction, comprising:
a semiconductor substrate including a memory cell region and a peripheral region adjacent the memory cell region;
at least one memory cell in the memory cell region, the memory cell comprising a cell transistor including a pair of source and drain regions, a cell capacitor in electrical contact with one of the source and drain regions, and a bitline in electrical contact with the other of the source and drain regions;
a conductive region in the peripheral region, the conductive region including a to surface;
an interlayer insulating material extending across the memory cell region and the peripheral region, and being between the bitline and the conductive region;
a covering material covering the to surface of the conductive region, the covering material being different in composition than the interlayer insulating material;
a fuse capacitor over the covering material; and
wherein the bitline comprises a first conductive layer and a first cap insulating material over the first conductive layer; wherein the conductive region comprises a second conductive layer and a second cap insulating material over the second conductive layer; and wherein the second cap insulating material is the covering material.

13. A semiconductor construction, comprising:
a semiconductor substrate including a memory cell region and a peripheral region adjacent the memory cell region;
at least one memory cell in the memory cell region, the memory cell comprising a cell transistor including a pair of source and drain regions, a cell capacitor in electrical contact with one of the source and drain regions, and a bitline in electrical contact with the other of the source and drain regions;
a conductive region in the peripheral region, the conductive region including a to surface;
an interlayer insulating material extending across the memory cell region and the peripheral region, and being between the bitline and the conductive region;
a covering material covering the to surface of the conductive region, the covering material being different in composition than the interlayer insulating material;
a fuse capacitor over the covering material; and
wherein the bitline comprises a first conductive layer and a first cap insulating material over the first conductive layer; wherein the conductive region comprises a second conductive layer and a second cap insulating material over the second conductive layer; and wherein the covering material is an insulative material covering the first cap insulating material and the second cap insulating material.

14. The construction of claim 13, wherein the interlayer insulating material and the covering material are substantially coplanar with one another.

15. The construction of claim 13 comprising a conductive plug between the cell capacitor and the one of the source and drain regions; the conductive plug, the interlayer insulating material and the covering material being substantially coplanar with one another.

16. The construction of claim 13, wherein each of the cell capacitor and the fuse capacitor is of an upwardly-opening container shape, and wherein the cell capacitor is smaller in cross-sectional dimension than the fuse capacitor.

17. A semiconductor construction, comprising:
a semiconductor substrate including a memory cell region and a peripheral region adjacent the memory cell region;
a memory cell in the memory cell region, the memory cell comprising a cell transistor including a pair of source and drain regions, a cell capacitor in electrical contact with one of the source and drain regions, and a bitline in electrical contact with the other of the source and drain regions;
a peripheral transistor in the peripheral region, the peripheral transistor comprising a gate electrode having common structural constituents as the bitline;
a conductive region in the peripheral region, the conductive region having common structural constituents as the bitline;
an interlayer insulating material within the memory cell and peripheral regions and extending laterally between the bitline, the gate electrode and the conductive region;

a first insulation material covering at least the conductive region, the first insulation material being different in composition relative to the interlayer insulating material; and a fuse capacitor over the first insulation material.

18. The construction of claim 17, wherein the bitline comprises a second insulation material, the gate electrode of the peripheral transistor comprises a third insulation material, and each of the second and third insulation materials are a same composition as the first insulation material.

19. The construction of claim 18, wherein the first, second and third insulation materials comprise silicon nitride.

20. The construction of claim 18, wherein the interlayer insulating material comprise silicon oxide, and each of the first, second and third insulation materials comprises silicon nitride.

21. The construction of claim 20 comprising a covering material against the interlayer insulating material, and comprising silicon nitride.

* * * * *